(12) United States Patent
Shmarev et al.

(10) Patent No.: US 10,866,526 B2
(45) Date of Patent: Dec. 15, 2020

(54) METROLOGY METHOD AND DEVICE

(71) Applicants: Yevgeniy Konstantinovich Shmarev, Lagrangeville, NY (US); Nitesh Pandey, Eindhoven (NL); Armand Eugene Albert Koolen, Nuth (NL)

(72) Inventors: Yevgeniy Konstantinovich Shmarev, Lagrangeville, NY (US); Nitesh Pandey, Eindhoven (NL); Armand Eugene Albert Koolen, Nuth (NL)

(73) Assignees: ASML Holding N.V., Veldhoven (NL); ASML Netherlands B.V., Veldhoven (NL)

( * ) Notice: Subject to any disclaimer, the term of this patent is extended or adjusted under 35 U.S.C. 154(b) by 136 days.

(21) Appl. No.: 16/135,259

(22) Filed: Sep. 19, 2018

(65) Prior Publication Data

US 2019/0094702 A1    Mar. 28, 2019

Related U.S. Application Data

(60) Provisional application No. 62/565,033, filed on Sep. 28, 2017.

(51) Int. Cl.
*G01N 21/956* (2006.01)
*G03F 7/20* (2006.01)
*G01N 21/88* (2006.01)
*G01N 21/95* (2006.01)

(52) U.S. Cl.
CPC ......... *G03F 7/7065* (2013.01); *G01N 21/956* (2013.01); *G03F 7/70566* (2013.01); *G03F 7/70575* (2013.01); *G03F 7/70608* (2013.01); *G03F 7/70625* (2013.01); *G03F 7/70633* (2013.01); *G03F 7/70683* (2013.01); *G01N 21/9501* (2013.01); *G01N 2021/8848* (2013.01)

(58) Field of Classification Search
None
See application file for complete search history.

(56) References Cited

U.S. PATENT DOCUMENTS

| | | | |
|---|---|---|---|
| 8,654,328 | B2 | 2/2014 | Tkaczyk et al. |
| 2008/0144036 | A1 | 6/2008 | Van Der Schaar et al. |
| 2008/0239318 | A1 | 10/2008 | Den Boef et al. |
| 2009/0244538 | A1 | 10/2009 | Den Boef et al. |

(Continued)

FOREIGN PATENT DOCUMENTS

| | | |
|---|---|---|
| EP | 1628153 | 2/2006 |
| EP | 1628164 | 2/2006 |

(Continued)

OTHER PUBLICATIONS

Taiwanese Office Action Issued in corresponding Taiwanese Patent Application No. 107133297, dated Oct. 28, 2019.

*Primary Examiner* — Rebecca C Bryant
(74) *Attorney, Agent, or Firm* — Pillsbury Winthrop Shaw Pittman LLP

(57) ABSTRACT

An inspection apparatus, including: an objective configured to receive diffracted radiation from a metrology target having positive and negative diffraction order radiation; an optical element configured to separate the diffracted radiation into portions separately corresponding to each of a plurality of different values or types of one or more radiation characteristics and separately corresponding to the positive and negative diffraction orders; and a detector system configured to separately and simultaneously measure the portions.

22 Claims, 11 Drawing Sheets

(56) References Cited

U.S. PATENT DOCUMENTS

| | | |
|---|---|---|
| 2010/0328655 A1 | 12/2010 | Den Boef |
| 2011/0027704 A1 | 2/2011 | Cramer et al. |
| 2011/0043791 A1 | 2/2011 | Smilde et al. |
| 2011/0102753 A1 | 5/2011 | Van De Kerkhof et al. |
| 2012/0242970 A1 | 9/2012 | Smilde et al. |
| 2015/0176979 A1 | 6/2015 | Mathijssen et al. |
| 2017/0082932 A1 | 3/2017 | Fu et al. |
| 2017/0184511 A1 | 6/2017 | Den Boef et al. |
| 2017/0184977 A1 | 6/2017 | Jak et al. |
| 2017/0184981 A1 | 6/2017 | Quintanilha et al. |
| 2017/0255104 A1 | 9/2017 | Polo et al. |

FOREIGN PATENT DOCUMENTS

| | | |
|---|---|---|
| TW | 201730546 | 9/2017 |
| TW | 201732224 | 9/2017 |
| TW | 201732270 | 9/2017 |
| WO | 2009078708 | 6/2009 |
| WO | 2009106279 | 9/2009 |

METROLOGY METHOD AND DEVICE

This application claims the benefit of priority to U.S. Patent Application No. 62/565,033, filed Sep. 28, 2017, which is incorporated herein in its entirety by reference.

FIELD

The present description relates to a method and apparatus for inspection (e.g., metrology) usable, for example, in the manufacture of devices by a lithographic technique.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

A lithographic apparatus can be used, for example, in the manufacture of integrated circuits (ICs) and other devices. In such a case, a patterning device (e.g., a mask) may contain or provide a pattern corresponding to an individual layer of the device ("design layout"), and this pattern can be transferred onto a target portion (e.g. comprising one or more dies) on a substrate (e.g., silicon wafer) that has been coated with a layer of radiation-sensitive material ("resist"), by methods such as irradiating the target portion through the pattern on the patterning device. In general, a single substrate contains a plurality of adjacent target portions to which the pattern is transferred successively by the lithographic apparatus, one target portion at a time. In one type of lithographic apparatuses, the pattern is transferred onto one target portion in one go; such an apparatus is commonly referred to as a wafer stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the pattern on the patterning device are transferred to one target portion progressively. Since, in general, the lithographic apparatus will have a magnification factor M (generally <1), the speed F at which the substrate is moved will be a factor M times that at which the beam scans the patterning device.

Prior to transferring the pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

As noted, lithography is a central step in the manufacturing of ICs and other devices, where patterns formed on substrates define functional elements of the devices, such as microprocessors, memory chips etc. Similar lithographic techniques are also used in the formation of flat panel displays, micro-electro mechanical systems (MEMS) and other devices.

In a lithographic process (i.e., a process of developing a device or other structure involving lithographic exposure, which may typically include one or more associated processing steps such as development of resist, etching, etc.), it is desirable frequently to make measurements of structures created, e.g., for process control and verification. Various tools for making such measurements are known, including scanning electron microscopes, which are often used to measure critical dimension (CD), and specialized tools to measure overlay, the accuracy of alignment of two layers of a substrate.

SUMMARY

It is desirable, for example, to enable measurement of a metrology target under different measurement conditions (e.g., different measurement beam wavelengths, different measurement beam polarizations, etc.). So, there is provided an apparatus and method to enable simultaneous measurement of a metrology target under different measurement conditions.

In an embodiment, there is provided an inspection apparatus, comprising: an objective configured to receive diffracted radiation from a metrology target having positive and negative diffraction order radiation; an optical element configured to separate the diffracted radiation into portions separately corresponding to each of a plurality of different values or types of one or more radiation characteristics and separately corresponding to the positive and negative diffraction orders; and a detector system configured to separately and simultaneously measure the portions.

In an embodiment, there is provided a method comprising: receiving diffracted radiation from a metrology target having positive and negative diffraction order radiation; separating the diffracted radiation into portions corresponding to each of a plurality of different values or types of one or more radiation characteristics and to the positive and negative diffraction orders; and separately and simultaneously measuring the portions.

In an embodiment, there is provided a method comprising: illuminating a metrology target with an illumination beam spot, wherein the metrology target comprises a plurality of different types of periodic structures and wherein, within the spot, there is only one type of periodic structure along a particular direction within the spot; receiving radiation from the metrology target; and separating the received radiation into portions corresponding to each of a plurality of different values or types of one or more radiation characteristics.

In an aspect, there is provided a non-transitory computer program product comprising machine-readable instructions for causing a processor system to cause performance of a method described herein. In an aspect, there is provided a computer program product comprising a computer non-transitory readable medium having instructions recorded thereon, the instructions when executed by a computer implementing a method or one or more process steps described herein. In an embodiment, there is provided a computer program product comprising a computer non-transitory readable medium having instructions recorded thereon, the instructions when executed by a computer implementing a method as described herein.

In an aspect, there is provided a metrology apparatus for measuring an object of a patterning process, the metrology apparatus configured to perform a method as described herein. In an aspect, there is provided an inspection apparatus for inspecting an object of a patterning process, the inspection apparatus being operable to perform a method as described herein.

In an aspect, there is provided a system comprising: a metrology apparatus configured to provide a beam of radiation onto an object surface and to detect radiation redirected by the structure on the object surface; and a computer program product as described herein. In an embodiment, the system further comprises a lithographic apparatus comprising a support structure configured to hold a patterning device to modulate a radiation beam and a projection optical system arranged to project the modulated radiation beam onto a radiation-sensitive substrate, wherein the object is the substrate and the lithographic apparatus is configured to control a setting of the lithographic apparatus based on information obtained using the metrology apparatus and the computer program product.

In an embodiment, there is provided a system comprising: a hardware processor system; and a non-transitory computer readable storage medium configured to store machine-readable instructions, wherein when executed, the machine-readable instructions cause the hardware processor system to perform a method as described herein.

Features and/or advantages of embodiments of the invention, as well as the structure and operation of various embodiments of the invention, are described in detail herein with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments will now be described, by way of example only, with reference to the accompanying drawings in which.

DETAILED DESCRIPTION

Before describing embodiments in detail, it is instructive to present an example environment in which embodiments may be implemented.

Figure 1:
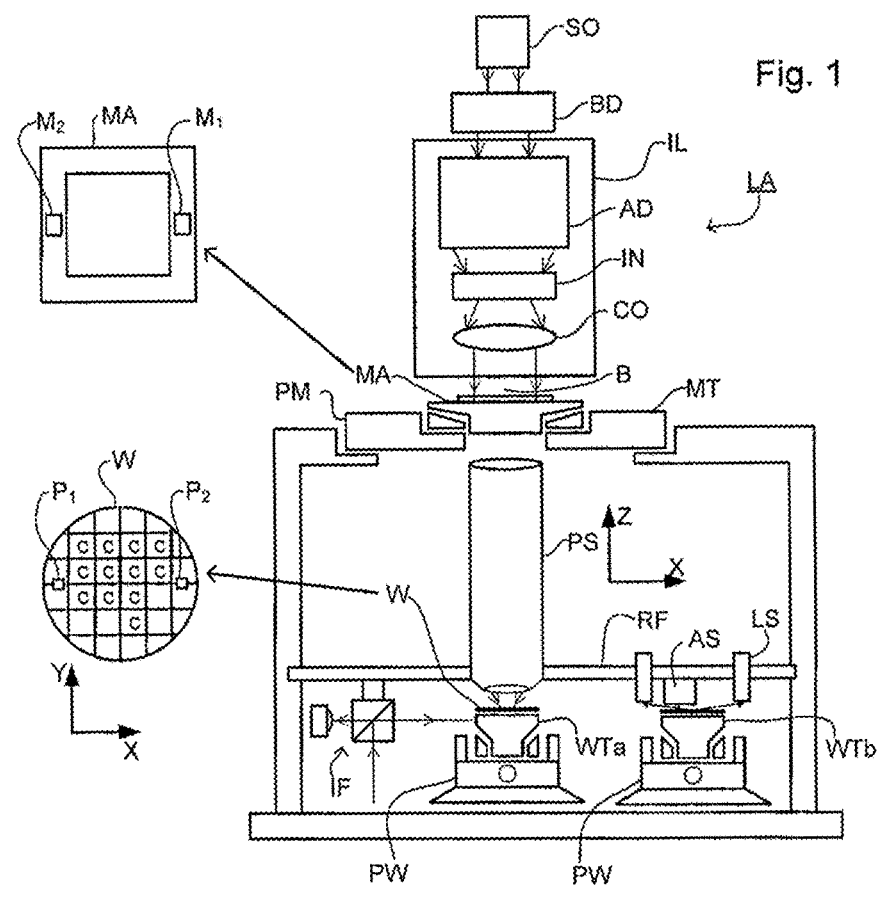
FIG. 1 schematically depicts a lithographic apparatus according to an embodiment.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular and/or spatial intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks $M_1$, $M_2$ and substrate alignment marks $P_1$, $P_2$. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features. An embodiment of an alignment system, which can detect the alignment markers, is described further below.

The depicted apparatus could be used in at least one of the following modes:

1. In step mode, the patterning device support (e.g., mask table) MT and the substrate table WTa are kept essentially stationary, while an entire pattern imparted to the radiation beam is projected onto a target portion C at one time (i.e., a single static exposure). The substrate table WTa is then shifted in the X and/or Y direction so that a different target portion C can be exposed. In step mode, the maximum size of the exposure field limits the size of the target portion C imaged in a single static exposure.

2. In scan mode, the patterning device support (e.g., mask table) MT and the substrate table WTa are scanned synchronously while a pattern imparted to the radiation beam is projected onto a target portion C (i.e., a single dynamic exposure). The velocity and direction of the substrate table WTa relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g., mask table) MT is kept essentially stationary holding a programmable patterning device, and the substrate table WTa is moved or scanned while a pattern imparted to the radiation beam is projected onto a target portion C. In this mode, generally a pulsed radiation source is employed and the programmable patterning device is updated as required after each movement of the substrate table WTa or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two tables WTa, WTb (e.g., two substrate tables) and two stations—an exposure station and a measurement station—between which the tables can be exchanged. For example, while a substrate on one table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS, both sensors being supported by a reference frame RF. If the position sensor IF is not capable of measuring the position of a table while it is at the measurement station as well as at the exposure station, a second position sensor may be provided to enable the positions of the table to be tracked at both stations. As another example, while a substrate on one table is being exposed at the exposure station, another table without a substrate waits at the measurement station (where optionally measurement activity may occur). This other table has one or more measurement devices and may optionally have other tools (e.g., cleaning apparatus). When the substrate has completed exposure, the table without a substrate moves to the exposure station to perform, e.g., measurements and the table with the substrate moves to a location (e.g., the measurement station) where the substrate is unloaded and another substrate is load. These multi-table arrangements enable a substantial increase in the throughput of the apparatus.

Figure 2:
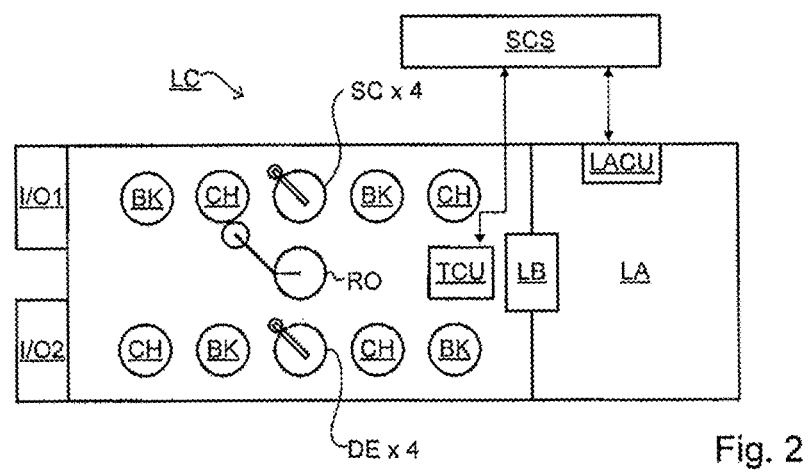
FIG. 2 schematically depicts a lithographic cell or cluster according to an embodiment.

As shown in FIG. 2, the lithographic apparatus LA forms part of a lithographic cell LC, also sometimes referred to as a lithocell or lithocluster, which also includes apparatus to perform one or more pre- and post-exposure processes on a substrate. Conventionally these include one or more spin coaters SC to deposit a resist layer, one or more developers DE to develop exposed resist, one or more chill plates CH and one or more bake plates BK. A substrate handler, or robot, RO picks up a substrate from input/output ports I/O1, I/O2, moves it between the different process devices and delivers it to the loading bay LB of the lithographic apparatus. These devices, which are often collectively referred to as the track, are under the control of a track control unit TCU which is itself controlled by the supervisory control system SCS, which also controls the lithographic apparatus via lithographic control unit LACU. Thus, the different apparatus may be operated to maximize throughput and processing efficiency.

In order that the substrate that is exposed by the lithographic apparatus is exposed correctly and consistently, it is desirable to inspect an exposed substrate to measure one or more properties such as overlay error between subsequent layers, line thickness, critical dimension (CD), etc. If an error is detected, an adjustment may be made to an exposure of one or more subsequent substrates, especially if the inspection can be done soon and fast enough that another substrate of the same batch is still to be exposed. Also, an already exposed substrate may be stripped and reworked (to improve yield) or discarded, thereby avoiding performing an exposure on a substrate that is known to be faulty. In a case where only some target portions of a substrate are faulty, a further exposure may be performed only on those target portions which are good. Another possibility is to adapt a setting of a subsequent process step to compensate for the error, e.g. the time of a trim etch step can be adjusted to compensate for substrate-to-substrate CD variation resulting from the lithographic process step.

An inspection apparatus is used to determine one or more properties of a substrate, and in particular, how one or more properties of different substrates or different layers of the same substrate vary from layer to layer and/or across a substrate. The inspection apparatus may be integrated into the lithographic apparatus LA or the lithocell LC or may be a stand-alone device. To enable most rapid measurements, it is desirable that the inspection apparatus measure one or more properties in the exposed resist layer immediately after the exposure. However, the latent image in the resist has a very low contrast—there is only a very small difference in refractive index between the part of the resist which has been exposed to radiation and that which has not—and not all inspection apparatus have sufficient sensitivity to make useful measurements of the latent image. Therefore measurements may be taken after the post-exposure bake step (PEB) which is customarily the first step carried out on an exposed substrate and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibility for rework of a faulty substrate but may still provide useful information, e.g. for the purpose of process control.

A target used by a conventional scatterometer comprises a relatively large periodic structure layout (e.g., comprising one or more gratings), e.g., 40 μm by 40 μm. In that case, the measurement beam often has a spot size that is smaller than the periodic structure layout (i.e., the layout is underfilled such that one or more of the periodic structures is not completely covered by the spot). This simplifies mathematical reconstruction of the target as it can be regarded as infinite. However, for example, so the target can be positioned in among product features, rather than in the scribe lane, the size of a target has been reduced, e.g., to 20 μm by 20 μm or less, or to 10 μm by 10 μm or less. In this situation, the periodic structure layout may be made smaller than the measurement spot (i.e., the periodic structure layout is overfilled). Typically such a target is measured using dark field scatterometry in which the zeroth order of diffraction (corresponding to a specular reflection) is blocked, and only higher orders processed. Examples of dark field metrology can be found in PCT patent application publication nos. WO 2009/078708 and WO 2009/106279, which are hereby incorporated in their entirety by reference. Further developments of the technique have been described in U.S. patent application publications US2011-0027704, US2011-0043791 and US2012-0242970, which are hereby incorporated in their entirety by reference. Diffraction-based overlay using dark-field detection of the diffraction orders enables overlay measurements on smaller targets. These targets can be smaller than the illumination spot and may be surrounded by product structures on a substrate. In an embodiment, multiple targets can be measured in one image.

In an embodiment, the target on a substrate may comprise one or more 1-D periodic gratings, which are printed such that after development, the bars are formed of solid resist lines. In an embodiment, the target may comprise one or more 2-D periodic gratings, which are printed such that after development, the one or more gratings are formed of solid resist pillars or vias in the resist. The bars, pillars or vias may alternatively be etched into the substrate. The pattern of the grating is sensitive to chromatic aberrations in the lithographic projection apparatus, particularly the projection system PL, and illumination symmetry and the presence of such aberrations will manifest themselves in a variation in the printed grating. Accordingly, the measured data of the printed gratings can be used to reconstruct the gratings. The parameters of the 1-D grating, such as line widths and shapes, or parameters of the 2-D grating, such as pillar or via widths or lengths or shapes, may be input to the reconstruction process, performed by processing unit PU, from knowledge of the printing step and/or other measurement processes.

Figure 3A:
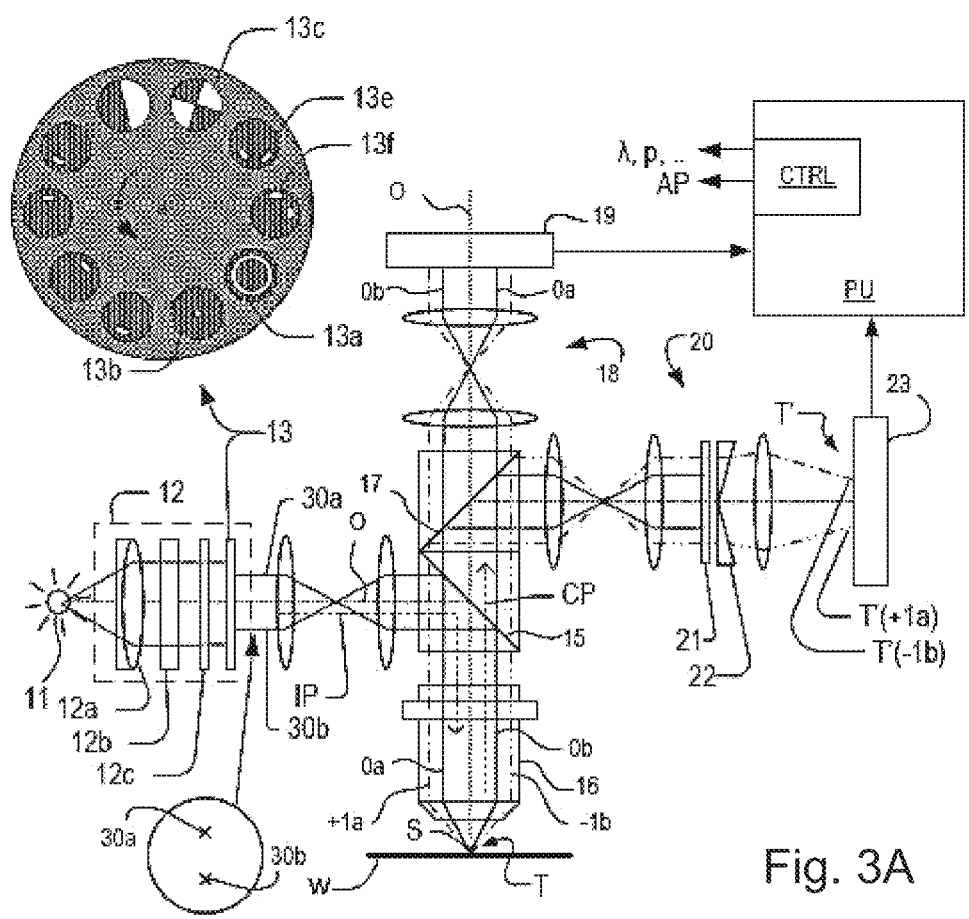
FIG. 3A is schematic diagram of an example inspection apparatus for use in measuring targets according to an embodiment using a first pair of illumination apertures providing certain illumination modes.

FIG. 3A shows schematically elements of an inspection apparatus implementing, e.g., so-called dark field imaging metrology. The apparatus may be a stand-alone device or incorporated in either the lithographic apparatus LA, e.g., at the measurement station, or the lithographic cell LC. An optical axis, which has several branches throughout the apparatus, is represented by a dotted line O. A target periodic structure T and diffracted rays are illustrated in more detail in FIG. 3B.

As described in the prior patent application publications cited in the introduction, the apparatus of FIG. 3A may be part of a multi-purpose angle-resolved scatterometer that may be used instead of, or in addition to, a spectroscopic scatterometer. In this type of inspection apparatus, radiation emitted by a radiation source 11 is conditioned by an illumination system 12. For example, illumination system 12 may include a collimating lens system 12a, a color filter 12b, a polarizer 12c and an aperture device 13. The conditioned radiation follows an illumination path IP, in which it is reflected by partially reflecting surface 15 and focused into a spot S on substrate W via an objective lens 16. A metrology target T may be formed on substrate W. The objective lens 16 may be similar in form to a microscope objective lens, but has, e.g., a high numerical aperture (NA), e.g., at least 0.9 or at least 0.95. Immersion fluid can be used to obtain numerical apertures over 1 if desired.

The objective lens 16 in this example serves also to collect radiation that has been scattered by the target. Schematically, a collection path CP is shown for this returning radiation. The multi-purpose scatterometer may have two or more measurement branches in the collection path. The illustrated example has a pupil imaging branch comprising pupil imaging optical system 18 and pupil image sensor 19. An imaging branch is also shown, which will be described in more detail below. Additionally, further optical systems and branches will be included in a practical apparatus, for example to collect reference radiation for intensity normalization, for coarse imaging of capture targets, for focusing and so forth. Details of these can be found in the prior publications mentioned above.

Where a metrology target T is provided on substrate W, this may be a 1-D periodic structure (e.g., a grating), which is printed such that, after development, the bars are formed of solid resist lines. The target may be a 2-D periodic structure, which is printed such that after development, the periodic structure is formed of solid resist pillars or vias in the resist. The bars, pillars or vias may alternatively be etched into the substrate. Each of these periodic structures is an example of a target structure whose properties may be investigated using the inspection apparatus. In the case of an overlay metrology target, the periodic structure is printed on top of or interleaved with another periodic structure that has been formed by a previous patterning step.

The various components of illumination system 12 can be adjustable to implement different metrology 'recipes' within the same apparatus. In addition to selecting wavelength (color) and polarization as characteristics of the illuminating radiation, illumination system 12 can be adjusted to implement different illumination profiles. The plane of aperture device 13 is conjugate with a pupil plane of objective lens 16 and with the plane of the pupil image detector 19.

Therefore, an illumination profile defined by aperture device 13 defines the angular distribution of radiation incident on substrate W in spot S. To implement different illumination profiles, an aperture device 13 can be provided in the illumination path. The aperture device may comprise different apertures 13a, 13b, 13c, etc. mounted on a movable slide or wheel. It may alternatively comprise a fixed or programmable spatial light modulator (SLM). As a further alternative, optical fibers may be disposed at different locations in the illumination pupil plane and used selectively to deliver radiation or not deliver radiation at their respective locations. These variants are all discussed and exemplified in the documents cited above. The aperture device may be of a reflective form, rather than transmissive. For example, a reflective SLM might be used. Indeed, in an inspection apparatus working in the UV or EUV waveband most or all of the optical elements may be reflective.

Figure 3B:
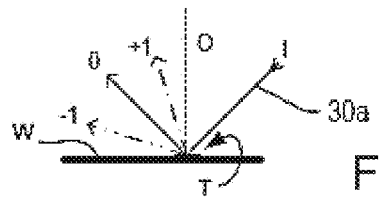
FIG. 3B is a schematic detail of a diffraction spectrum of a target for a given direction of illumination.

Depending on the illumination mode, example rays 30a may be provided so that the angle of incidence is as shown at 'I' in FIG. 3B. The path of the zero order ray reflected by target T is labeled '0' (not to be confused with optical axis 'O'). Similarly, in the same illumination mode or in a second illumination mode, rays 30b can be provided, in which case the angles of incidence and reflection will be swapped compared with the first mode. In FIG. 3A, the zero order rays of the first and second example illumination modes are labeled 0a and 0b respectively.

As shown in more detail in FIG. 3B, target periodic structure T as an example of a target structure is placed with substrate W normal to the optical axis O of objective lens 16. In the case of an off-axis illumination profile, a ray 30a of illumination I impinging on periodic structure T from an angle off the axis O gives rise to a zeroth order ray (solid line 0) and two first order rays (dot-chain line +1 and double dot-chain line −1). It should be remembered that with an overfilled small target periodic structure, these rays are just one of many parallel rays covering the area of the substrate including metrology target periodic structure T and other features. Since the beam of illuminating rays 30a has a finite width (necessary to admit a useful quantity of radiation), the incident rays I will in fact occupy a range of angles, and the diffracted rays 0 and +1/−1 will be spread out somewhat. According to the point spread function of a small target, the diffracted radiation of each order +1 and −1 will be further spread over a range of angles, not a single ideal ray as shown.

If the target has multiple periodic components, then each of those will give rise to first and higher diffracted rays, which may be in directions into or out of the page. The example of FIG. 3B is merely describing a one-dimensional grating for simplicity.

In the branch of the collection path for dark-field imaging, imaging optical system 20 forms an image T' of the target on the substrate W on sensor 23 (e.g. a CCD or CMOS sensor). An aperture stop 21 is provided in a plane in the imaging branch of the collection path CP which is conjugate to a pupil plane of objective lens 16. Aperture stop 21 may also be called a pupil stop. Aperture stop 21 can take different forms, just as the illumination aperture can take different forms. The aperture stop 21, in combination with the effective aperture of lens 16, determines what portion of the scattered radiation is used to produce the image on sensor 23. Typically, aperture stop 21 functions to block the zeroth order diffracted beam so that the image of the target formed on sensor 23 is formed only from the first order beam(s). In an example where both first order beams were combined to form an image, this would be the so-called dark field image, equivalent to dark-field microscopy.

The images captured by sensor 23 are output to image processor and controller PU, the function of which will depend on the particular type of measurements being performed. For the present purpose, measurements of asymmetry of the target structure are performed. Asymmetry measurements can be combined with knowledge of the target structures to obtain measurements of performance parameters of lithographic process used to form them. One or more performance parameters that can be measured in this way include for example overlay, focus and/or dose. Special designs of targets are provided to allow these measurements of different performance parameters to be made through the same basic asymmetry measurement method.

Processor and controller PU also generates control signals such as A and AP, for controlling the illumination characteristics (e.g., polarization, wavelength, etc.) and for selecting the aperture using aperture device 13 or a programmable spatial light modulator (which can define the radiation intensity distribution and/or radiation incident angle). Aperture stop 21 may also be controlled in the same way. Each combination of these parameters of the illumination and the detection is considered a "recipe" for the measurements to be made.

Referring again to FIG. 3B and the illuminating rays 30a, +1 order diffracted rays from the target periodic structure will enter the objective lens 16 and contribute to the image recorded at sensor 23. Rays 30b are incident at an angle opposite to rays 30a, and so the −1 order diffracted rays enter the objective and contribute to the image. Aperture stop 21 blocks the zeroth order radiation when using off-axis illumination. As described in the prior publications, illumination modes can be defined with off-axis illumination in X and Y directions.

Apertures 13c, 13e and 13f in the aperture device 13 of FIG. 3A include off-axis illumination in both X and Y directions, and are of particular interest for the present disclosure. Aperture 13c creates what may be referred to as a segmented illumination profile, and may for example be used in combination with a segmented aperture defined for example by a segmented prism 22, described below. Apertures 13e and 13f may for example be used in combination with an on-axis aperture stop 21, in a manner described in some of the prior mentioned patent application publications.

By comparing images of the target periodic structure under these different illumination modes, asymmetry measurements can be obtained. Alternatively, asymmetry measurements could be obtained by keeping the same illumination mode, but rotating the target. While off-axis illumination is shown, on-axis illumination of the targets may instead be used and a modified, off-axis aperture stop 21 could be used to pass substantially only one first order of diffracted radiation to the sensor. In a further example, a segmented prism 22 is used in combination with an on-axis illumination mode. The segmented prism 22 can be regarded as a combination of individual off-axis prisms, and can be implemented as a set of prisms mounted together, if desired. These prisms define a segmented aperture in which rays in each quadrant are deflected slightly through an angle. This deflection in the pupil plane has the effect of spatially separating the +1 and −1 orders in each direction in the image plane. In other words, the radiation of each diffraction order and direction forms an image to different locations on sensor 23 so that they can be detected and compared without the need for two sequential image capture steps. Effectively, separate images are formed at separated locations on the image sensor 23. In FIG. 3A for example, an image T'(+1a), made using +1 order diffraction from illuminating ray 30a, is spatially separated from an image T'(−1b) made using −1 order diffraction from illuminating ray 30b. This technique is disclosed in the U.S. patent application publication no. US 2011-0102753, the contents of which are hereby incorporated by reference in its entirety. 2nd, 3rd and higher order beams (not shown in FIG. 3) can be used in measurements, instead of, or in addition to, the first order beams. As a further variation, the off-axis illumination mode can be kept constant, while the target itself is rotated 180 degrees beneath objective lens 16 to capture images using the opposite diffraction orders.

Whichever of these techniques is used, the present disclosure applies to methods in which radiation diffracted in two directions, for example the orthogonal directions called X and Y, is simultaneously captured.

While a conventional lens-based imaging system is illustrated, the techniques disclosed herein can be applied equally with plenoptic cameras, and also with so-called "lensless" or "digital" imaging systems. There is therefore a large degree of design choice, which parts of the processing system for the diffracted radiation are implemented in the optical domain and which are implemented in the electronic and software domains.

A measurement of asymmetry A can be calculated from the intensities of detected radiation for the +1 and −1 diffraction orders. In the formula:

$$A = I_{+1} - I_{-1} \quad (1)$$

the asymmetry measurement is calculated as a difference between intensities measured for the +1 and −1 orders. For each intensity measurement I, the subscript denotes the diffraction order +1 or −1.

Figure 4A:
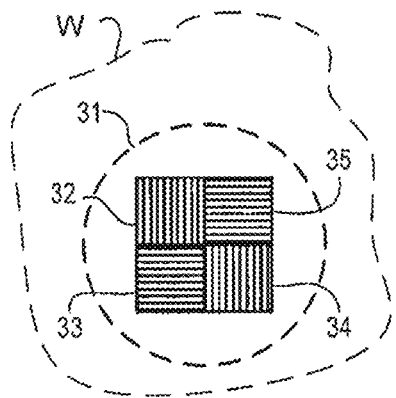
FIG. 4A schematically depicts a form of multiple periodic structure (e.g., multiple grating) target and an outline of a measurement spot on a substrate.

FIG. 4A depicts an example composite target formed on a substrate according to a known practice. The composite target comprises four periodic structures (in this case, gratings) 32 to 35. In an embodiment, the periodic structures are positioned closely together enough so that they all are within a measurement spot S, 31 formed by the illumination beam of the metrology apparatus. In that case, the four periodic structures thus are all simultaneously illuminated and simultaneously imaged on sensor 19 and/or sensor 23. In an example dedicated to overlay measurement, periodic structures 32 to 35 are themselves composite periodic structures (e.g., composite gratings) formed by overlying periodic structures, i.e., periodic structures are patterned in different layers of the device formed on substrate W and such that at least one periodic structure in one layer overlays at least one periodic structure in a different layer. Such a target may have outer dimensions within 20 µm×20 µm or within 16 µm×16 µm. Further, all the periodic structures are used to measure overlay between a particular pair of layers. To facilitate a target being able to measure more than a single pair of layers, periodic structures 32 to 35 may have differently biased overlay offsets in order to facilitate measurement of overlay between different layers in which the different parts of the composite periodic structures are formed. Thus, all the periodic structures for the target on the substrate would be used to measure one pair of layers and all the periodic structures for another same target on the substrate would be used to measure another pair of layers, wherein the different bias facilitates distinguishing between the layer pairs.

Returning to FIG. 4A, periodic structures 32, 33, 34, 35 may also differ in their orientation, as shown, so as to diffract incoming radiation in X and Y directions. In one example, periodic structures 32 and 34 are X-direction periodic structures with biases of +d, −d, respectively. Periodic structures 33 and 35 may be Y-direction periodic structures with offsets +d and −d respectively. Bias +d means that one of the periodic structures has its components arranged so that if they were both printed exactly at their nominal locations one of the components would be offset relative to the other by a distance d. A bias −d means that an overlay periodic structure has its components arranged so that, if perfectly printed, there would be an offset of d but in the opposite direction to the first periodic structure and so on. While four periodic structures are illustrated, another embodiment may include a larger matrix to obtain desired accuracy. For example, a 3×3 array of nine composite periodic structures may have biases −4d, −3d, −2d, −d, 0, +d, +2d, +3d, +4d. Separate images of these periodic structures can be identified in the image captured by sensor 23.

Figure 4B:
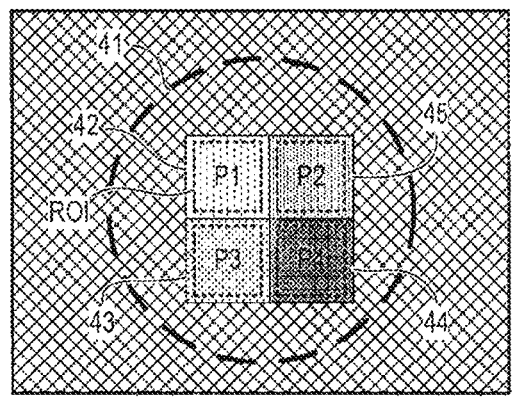
FIG. 4B schematically depicts an image of the target of FIG. 4A obtained in the apparatus of FIG. 3.

FIG. 4B shows an example of an image that may be formed on and detected by the sensor 23, using the target of FIG. 4A in the apparatus of FIG. 3A. While the pupil image sensor 19 cannot resolve the different individual periodic structures 32 to 35, the sensor 23 can do so. The dark rectangle labeled 40 represents the field of the image on the sensor 23, within which the illuminated spot 31, S on the substrate is imaged into a corresponding circular area 41. Within this, rectangular areas 42-45 represent the images of the small target periodic structures 32 to 35. If the periodic structures are located in product areas, product features may also be visible in this image. Image processor and controller PU processes these images to identify the separate images 42 to 45 of periodic structures 32 to 35. This can be done by pattern matching techniques, so that the images do not have to be aligned very precisely at a specific location within the sensor frame. Reducing the need for accurate alignment in this way greatly improves throughput of the measuring apparatus as a whole. However, positional variation may introduce inaccuracies in the measurement results, if the imaging process is subject to non-uniformities across the image field. Not only properties of the various components in the optical path, but also intensity of illumination and sensitivity of detection can vary across the image field. In United States patent application publication no. US 2012-0242970, corrections are made in the measured intensities, according to the position at which each periodic structure image is observed within the field of sensor 23. Such corrections can be applied in the techniques of the present disclosure as well.

Once the separate images of the periodic structures have been identified, the intensities of those individual images can be measured, e.g., by averaging or summing selected pixel intensity values within the identified areas. Intensities and/or other properties of the images can be compared with one another. These results can be combined to measure different parameters of the lithographic process. Overlay performance, which can be measured by measuring asymmetry of a periodic structure target, is an example of such a parameter.

Figure 5:
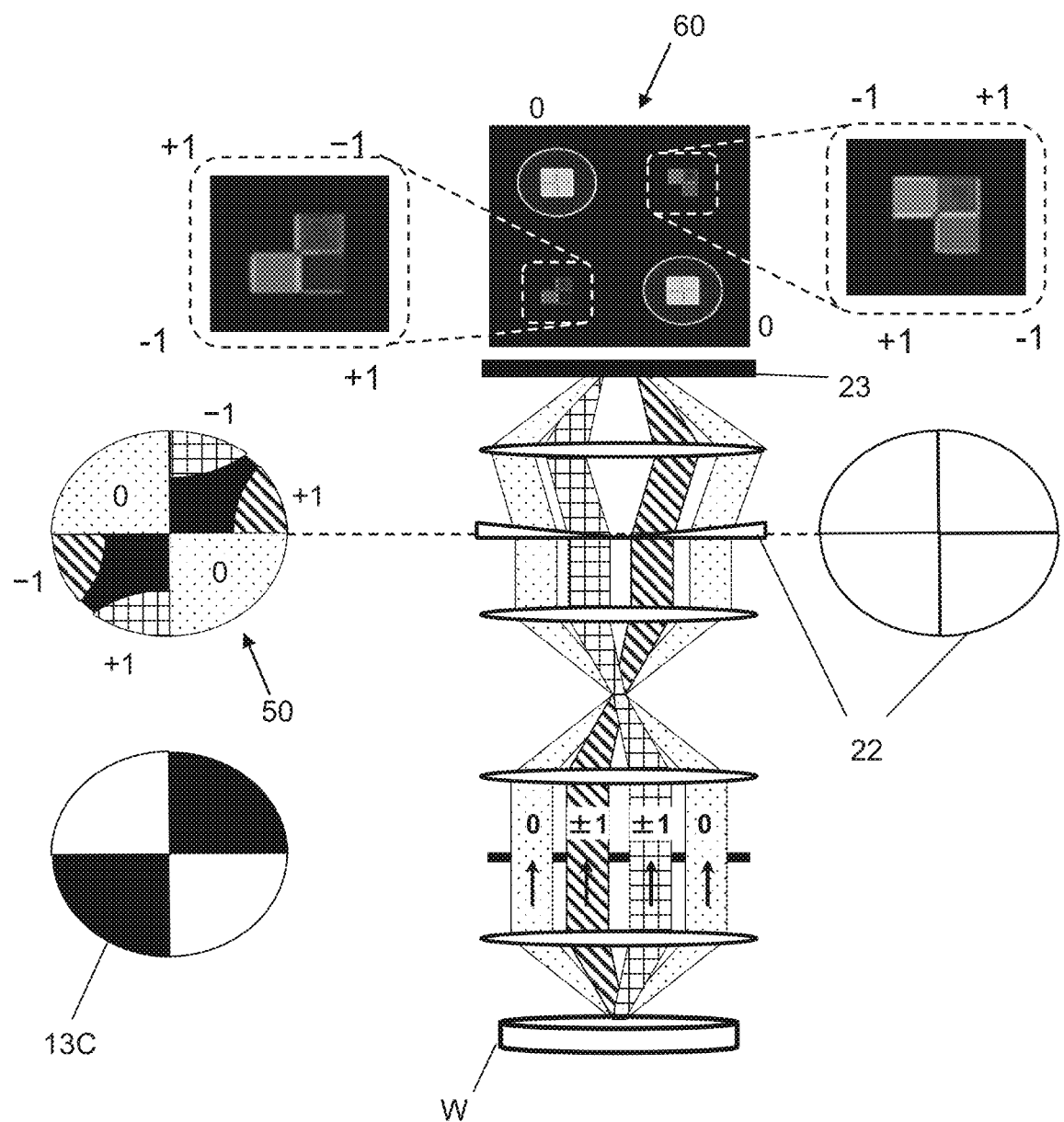
FIG. 5 schematically depicts a particular detail of an embodiment of the inspection apparatus as depicted in FIG. 3A.

A particular detail of an embodiment of the inspection apparatus as depicted in FIG. 3A is shown in FIG. 5. In FIG. 5, a particular type of illumination, specifically a segmented illumination profile (e.g. in this example, four quadrants within an imaginary circle where two diagonally opposite quadrants have radiation while the other two diagonally opposite quadrants have substantially no radiation), is shown that can be produced using aperture 13c. FIG. 5 further shows schematically the propagation of some of the various radiation orders, specifically the 0, +1 and −1 orders, from a metrology target such as the target schematically depicted in FIG. 4C. A detection pupil 50 is shown comprising the various radiation orders. In this example, the 0 order radiation is effectively confined to the upper left and lower right quadrants. Further, the +1 and −1 radiation from the metrology target is effectively confined to the upper right and lower left quadrants. In particular, the upper right quadrant has the −1 radiation from a first of the orientation types of periodic structure (e.g., the Y overlay measuring periodic structure such as periodic structures 33 and 35 in FIG. 4A) and the +1 radiation from a second of the orientation types of periodic structure (e.g., the X overlay measuring periodic structure such as periodic structures 32 and 34 in FIG. 4A). Then, the lower left quadrant has the opposite combination from the upper right quadrant, specifically the −1 radiation from second orientation type of periodic structure (e.g., the X overlay measuring periodic structure such as periodic structures 32 and 34 in FIG. 4A) and the +1 radiation from the first orientation type of periodic structure (e.g., the Y overlay measuring periodic structure such as periodic structures 33 and 35 in FIG. 4A). Of course, the location of the radiation orders in the detection pupil for the different orientation types of the periodic structure can be different. Then, an optical element 22 (e.g., a prism, such as a wedge type structure comprising a plurality of wedge segments, or a dish-type form transparent optical element) can be used to spatially separate/diverge the radiation onto the detector 23. In an embodiment, the optical element 22 is arranged to separate/diverge the +1 order radiation differently from the −1 order radiation. An example of the detected radiation 60 is shown, wherein the 0 order radiation is shown in the upper left and lower right portions (although in an embodiment, the optical element 22 (or some other structure) can block the 0 order radiation where it is not needed). Then, the lower left and upper right show two "images" of the metrology target with the particular radiation order captured for each periodic structure as marked. As can be seen, each of the +1 and −1 order radiation is separately captured for each of the periodic structures 32-35. In an embodiment, an average intensity can be extracted from each periodic structure 32-35 "image" to yield 8 intensity values to determine overlay in the X and Y directions as discussed further hereafter.

Different targets can be designed so that their asymmetry depends strongly on a parameter of interest for measurement of the lithographic process. For the examples described herein it is assumed that target is designed for measurement of overlay as a parameter of interest. A measurement of overlay OV in the vicinity of this target can be calculated as a function of the asymmetries measured for two or more periodic structures, using knowledge of the different bias values they contain. That is to say, the unknown overlay OV can be calculated using measurements of asymmetry of biased periodic structures, combined with knowledge of the different biases in the periodic structures. Noting that the example target of FIG. 4A is a composite target with component periodic structures in X and Y directions, and having two bias values +d and −d, it will be understood that the target allows measurements of overlay in both X and Y directions to be calculated from measurements of asymmetry of those target periodic structures. In one example, overlay in a particular direction (e.g., X or Y) is calculated by the formula:

$$OV = \frac{p}{2\pi} \cdot \operatorname{atan}\left(\tan\left(\frac{2\pi d}{p}\right) \cdot \frac{A_{+d} + A_{-d}}{A_{+d} - A_{-d}}\right) \qquad (2)$$

where d is the amount of bias, p is the periodic structure pitch, $A_{+d}$ is the difference between intensities measured for the +1 and −1 orders of the target periodic structure of the applicable orientation type having the +d bias (e.g., periodic structure 32 where overlay in the X direction is being determined or periodic structure 33 where overlay in the Y direction is being determined) and A–d is the difference between intensities measured for the +1 and −1 orders of the target having the −d bias (e.g., periodic structure 34 where overlay in the X direction is being determined or periodic structure 35 where overlay in the Y direction is being determined). Bias and pitch may be expressed for example in nanometers (nm) such that overlay is expressed in nanometers.

The measurement accuracy and/or sensitivity of the target may vary with respect to one or more characteristics of the beam of radiation provided onto the target, for example, the wavelength of the radiation beam, the polarization of the radiation beam, the intensity distribution (i.e., angular or spatial intensity distribution) of the radiation beam, and/or the radiation incident angle. So, it is desirable to measure the target with more than one combination of different values and/or types of characteristics of the beam of radiation (e.g., two or more different wavelengths, two or more different polarizations, etc.).

As on-product requirements (such as on-product overlay) continue to tighten in order to support the demands of, e.g., 10 nm and 7 nm nodes, there is a desire for simultaneously accurate, robust and dense metrology data as input for, e.g., closed-loop control solution to enable substrate-level control and high order corrections. Further, the use of opaque materials and stringent design rules drives a need for the expansion of the available measurement wavelengths and metrology target design space. So, a way to improve measurement accuracy and process robustness, such as for measuring opaque materials, is implementation of measurement using multiple characteristics of the measurement beam, particularly multiple measurement beam wavelengths.

One way to implement measurement using multiple wavelengths is to sequentially in time tune a measurement beam wavelength. For example, the different wavelengths can be obtained by switching the color filter 12b in the metrology system illumination branch. But, this can have significant impact to sensor productivity and operation cycle time. So, because many of the newest nodes will desirably use more than one measurement beam wavelength, it is expected that measuring two or more wavelengths in parallel will be desired to enable future metrology.

Accordingly, there is provided a diffraction-based metrology sensor system configured to measure in parallel using a plurality of different types or values of measurement beam characteristics. That is, in an embodiment, there is provided a hyperspectral or multispectral optical system to provide the capability of parallel measurements of a metrology target with different radiation wavelengths to obtain a value of a parameter, such as overlay, measured in a wide spectral range. In an embodiment, there is provided an optical system to enable such parallel measurement that can be integrated into an existing metrology apparatus without significant redesign. In an embodiment, the optical system can be implemented such that the metrology apparatus can be toggled between an existing functionality of the metrology apparatus and a functionality of measurement in parallel using a plurality of different types or values of measurement beam characteristics (e.g., a hyperspectral or multispectral functionality). In an embodiment, such toggling can be enabled by moving at least part of the optical system within or into/out of an optical path of the metrology apparatus. So, in an embodiment, there is provided a relatively simple and cost effective optical system that can be implemented on an existing metrology apparatus with minimal investment in modification of metrology apparatus hardware to enable measurement in parallel using a plurality of different types or values of measurement beam characteristics. Further, as will be discussed in more detail below, there is provided, in an embodiment, a specific configuration of a metrology target in combination with an optical system to enable measurement in parallel using a plurality of different types or values of measurement beam characteristics.

So, first, there will be discussed an embodiment of the optical system to enable measurement in parallel using a plurality of different types or values of measurement beam characteristics, followed by more detailed discussion of possible specific configurations of the metrology target that can be used with the optical system. An embodiment of the optical system will be described with a particular focus on measurement in parallel using a plurality of different values of a particular measurement beam characteristic, namely wavelength. However, as will be appreciated, the optical system could be set up to measure in parallel using a plurality of different types or values of measurement beam characteristics at a single wavelength if desired. For example, it could be setup to measure in parallel using a plurality of different polarizations (e.g., TM and TE polarization) at a single wavelength.

Figure 6:
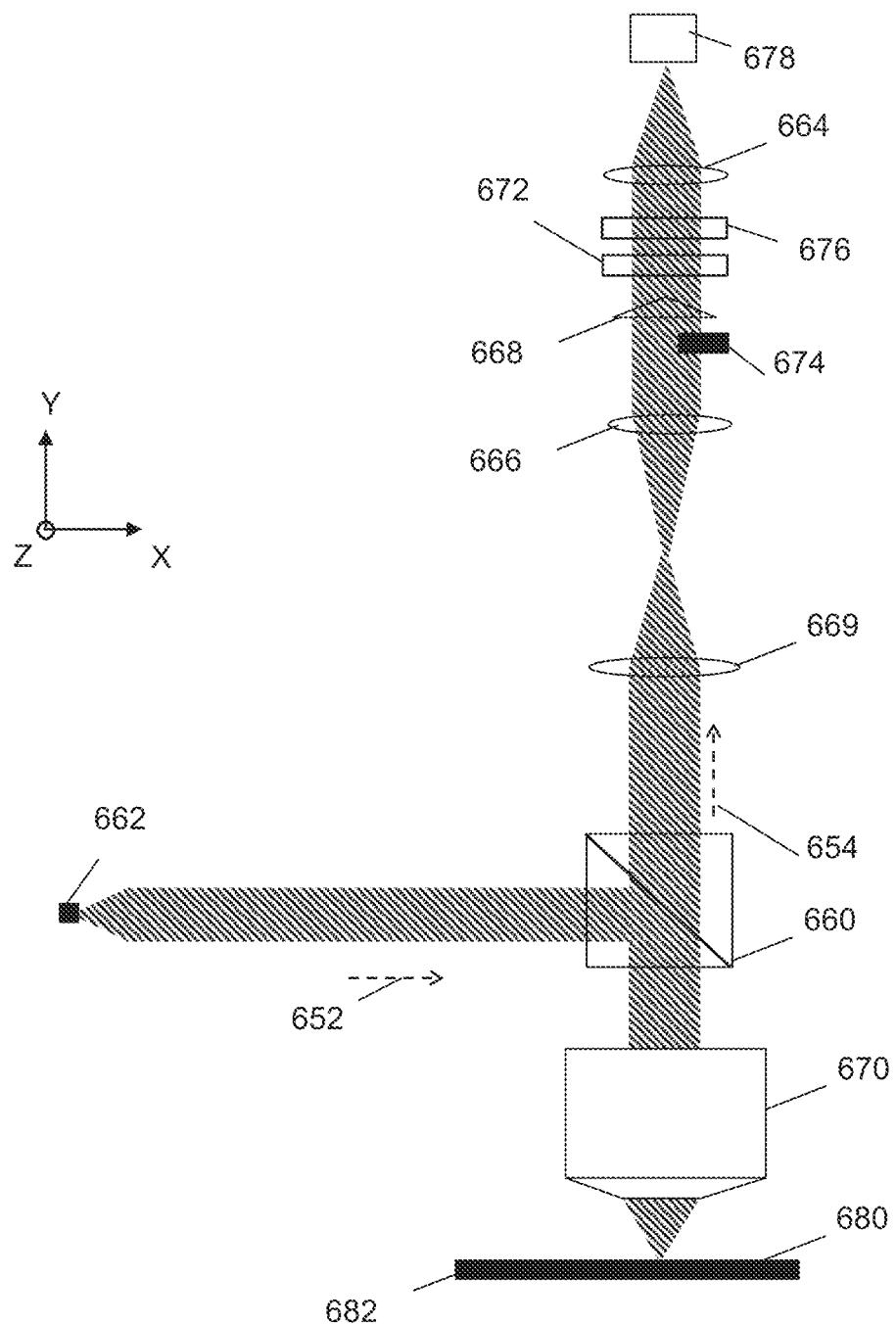
FIG. 6 schematically depicts an embodiment of part of an inspection apparatus.

Referring to FIG. 6, a highly schematic illustration of embodiment of an inspection apparatus is depicted for diffraction-based metrology. In this embodiment, a dispersive optical component is used to enable separation of radiation of different wavelengths into different areas of one or more detectors to enable separate and parallel measurement of radiation of different wavelengths.

In particular, FIG. 6 depicts a schematic illustration of an example inspection apparatus 600 (e.g., metrology apparatus) configured to provide optical measurement of, for example, CD, overlay, etc. As shown in FIG. 6, the inspection apparatus 600 comprises an objective 670, a substrate holder 682 configured to hold a substrate 680, and a detector 678.

The objective 670 and the detector 678 are collectively configured to measure the target of the substrate 680 to determine, for example, CD, overlay, focus, dose, etc. Specifically, a measurement beam 652 emitted by an input 662 (e.g., a radiation source such as a lamp or laser, or an input connected or connectable to a radiation source) is directed toward a partially reflective optical element 660. The measurement beam 652 is further directed onto the target by the partially reflective optical element 660 and the objective 670, and subsequently radiation from the measurement beam 652 is redirected by the target. At least a portion of the redirected measurement beam 654 is collected by the objective 670 and directed toward the detector 678 (e.g. a CCD or CMOS sensor) via the objective 670, the partially reflective optical element 660, the lens 669, the lens 666 and lens 664. A different lens arrangement can be used, provided that it still provides the radiation of the target onto the detector 678. In an embodiment, the lens 669, the lens 666 and lens 664 are arranged to re-image the pupil.

In an embodiment, an optical element 668 (e.g., a prism, such as a wedge type structure comprising a plurality of wedge segments, or a dish-type form transparent optical element) can be used to spatially separate/diverge the radiation toward the detector 678. In an embodiment, the optical element 668 is arranged to separate/diverge the +1 order radiation differently from the −1 order radiation. Thus, in an embodiment, the optical element 668 acts as a pupil splitter to spatially separate the +1 and −1 diffraction order radiation toward the one or more detectors 678.

Optionally, a block 674 can be provided to block 0 order radiation. This can be used to reduce potential of noise in the measurement due to the 0 order radiation where only the 1 or higher diffraction orders are used to determine the parameter of interest from the detected radiation. In an embodiment, the block 674 can be a separate element. In an embodiment, the block 674 can be integrated with another optical element such as optical element 668. In an embodiment, where the illumination has a distribution of, e.g., the form shown in FIG. 5, the block 674 can have the shape of two absorbing quadrants corresponding to the 0 order radiation shown in FIG. 5 to block the 0 order radiation (but as will be appreciated the arrangement of the block 674 depends on the illumination type of the target). In an embodiment, the block 675 is located in the pupil plane. In an embodiment, the block 675 is conjugate to aperture 13 in the illuminator.

In an embodiment, to enable the measurement in parallel using a plurality of different types or values of measurement beam characteristics, one or more optical elements are provided to enable separation of the beam 654 into separate portions that have different values or types of one or more measurement beam characteristics. In an embodiment, the one or more optical elements comprises a dispersive optical element 672 configured to separate the beam 654 into separate portions corresponding to different wavelengths. In an embodiment, the dispersive optical element can be a diffraction grating, a prism, or both. In an embodiment, the dispersive optical element comprises double-amici prisms. In an embodiment, the dispersive optical element is reflective (e.g, a diffraction grating arranged such that substantially all radiation reflects/diffracts off the surface) In an embodiment, the dispersive optical element is transmissive. In an embodiment, the dispersive optical element comprises an optical element with a surface acoustic wave generator to form a grating on a surface of the optical element using surface acoustic waves. Additionally or alternatively, the one or more optical elements comprises a polarization element 676 configured to separate the beam 654 into separate portions corresponding to different polarizations. In an embodiment, the polarization element comprises a Wollaston prism, a Rochon prism or similar optical element. In an embodiment, the polarization element comprises a polarizing beam splitter, in which the detector may comprise two or more detectors.

In an embodiment, both the dispersive element and the polarization element are provided to enable separation by both wavelength and polarization. In an embodiment, the polarization element is combined in a single design with the dispersive optical element (e.g., in the form of a grating or prism).

In an embodiment, the one or more optical elements provided to enable separation of the beam 654 into separate portions that have different values or types of one or more measurement beam characteristics are located downstream from the optical element 668 and optional block 674 in the pupil of the detection branch.

In an embodiment, the one or more optical elements provided to enable separation of the beam 654 into separate portions that have different values or types of one or more measurement beam characteristics are movable into and out of the beam path such that with one or more optical elements out of the path the inspection apparatus can be used in a conventional manner. In an embodiment, the one or more optical elements provided to enable separation of the beam 654 into separate portions that have different values or types of one or more measurement beam characteristics are configured to transform in configuration so as to allow the diffracted radiation to pass without separation. For example, in an embodiment, the one or more optical elements are rotated or displaced such that diffracted radiation passes through, or is reflected by, the one or more optical elements such that the diffracted radiation passes without separation.

Using the dispersive optical element 672 and/or polarization element 676, the beam 654 would be separated into portions that have different values or types of one or more measurement beam characteristics such that they would be spatially separated at the one or more detectors 678 so that each of the different values or types of one or more measurement beam characteristics can be separately measured. So, for example, each of a plurality of periodic structures of a target can be separately detected as well as for each of a plurality of different diffraction orders (e.g., $+1^{st}$ and $-1^{st}$) as in a conventional embodiment (e.g., as described in respect of FIG. 5), but can be further spatially separated so that each of those separate measurements can be obtained for each of a plurality of different values or types of one or more measurement beam characteristics (e.g., wavelength and/or polarization). Thus, the detector 678 can obtain radiation parameter (e.g., intensity) values for the various periodic structures (including one or more +d biased periodic structures and one or more −d biased periodic structures) and for each of the $+1^{st}$ and $-1^{st}$ orders and for two or more different values or types of one or more measurement beam characteristics (e.g., wavelength and/or polarization). In an embodiment, the radiation parameter is intensity. In an embodiment, the radiation parameter is an asymmetry in the intensity between the $+1^{st}$ and $-1^{st}$ orders for the particular periodic structure. In an embodiment, the radiation parameters are obtained for two or more wavelengths. In an embodiment, the radiation parameters are obtained for two or more polarizations. In an embodiment, the radiation parameters are combined into different parameter values (e.g., an asymmetry in the intensity between the $+1^{st}$ and $-1^{st}$ orders for a particular periodic structure).

So, in an embodiment, an overlay metrology target for a particular direction (e.g., the X direction) can comprise two periodic structures (each having a periodic structure element in each of two layers), a first periodic structure having a bias of +d and a second with a bias of −d. See, e.g., periodic structures 32 and 34. In an embodiment, the periodic structures comprise a plurality of gratings but could take any form. Where the periodic structures are illuminated with radiation having two different values of types of a measurement beam characteristic (such as two different wavelengths or two different polarizations (e.g., two orthogonal linear polarizations, for example TE and TM radiation)), then there are four intensity asymmetries of interest:

$$A1 = \frac{I_{1+}^{+1} - I_{1+}^{-1}}{I_{1+}^{+1} + I_{1+}^{-1}} \qquad (3)$$

$$A2 = \frac{I_{1-}^{+1} - I_{1-}^{-1}}{I_{1-}^{+1} + I_{1-}^{-1}} \qquad (4)$$

$$A3 = \frac{I_{2+}^{+1} - I_{2+}^{-1}}{I_{2+}^{+1} + I_{2+}^{-1}} \quad (5)$$

$$A4 = \frac{I_{2-}^{+1} - I_{2-}^{-1}}{I_{2-}^{+1} + I_{2-}^{-1}} \quad (6)$$

where subscripts 1 and 2 indicate respectively one of two different values or types of measurement beam characteristics, the + and − subscripts indicate the sign of the bias d of the periodic structures, and the superscripts refers to diffraction order (in this case, +1$^{st}$ and −1$^{st}$ diffraction order). These four asymmetries can be used by a processor, comprising, for example, suitable software, to calculate the overlay error OV according to, e.g.:

$$OV = \frac{d(A3 - A4) - (A1 - A2)}{(A3 + A4) - (A1 + A2)} \quad (7)$$

wherein d is the bias.

Figure 7:
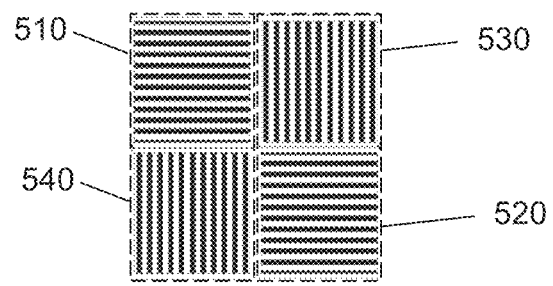
FIG. 7 schematically depicts an embodiment of a metrology target.

Referring to FIG. 7, an example of a conventional measurement target 500 is depicted having periodic structures 510, 520, 530 and 540. In this example target, periodic structures 510, 520 of a first type are arranged for Y direction overlay measurement and periodic structures 530, 540 of a second type are arranged for X direction overlay measurement. Further, in this embodiment, the periodic structure 510 has a same absolute value of bias d as periodic structure 520 but of different signs. For example, periodic structure 510 has a bias of −d and periodic structure 520 has a bias of +d. Similarly, the periodic structure 530 has a same absolute value of bias d as periodic structure 540 but of different signs. For example, periodic structure 530 has a bias of −d and periodic structure 540 has a bias of +d. If a dispersive element were to be used with the target 500 as shown in FIG. 7, the radiation of different wavelengths from one periodic structure would likely overlap with radiation of different wavelengths from another periodic structure such that the intensity of different wavelengths and for different periodic structures may not be separated in order to be readily be able to obtain measurements for the different periodic structures at different wavelengths.

Figure 8:
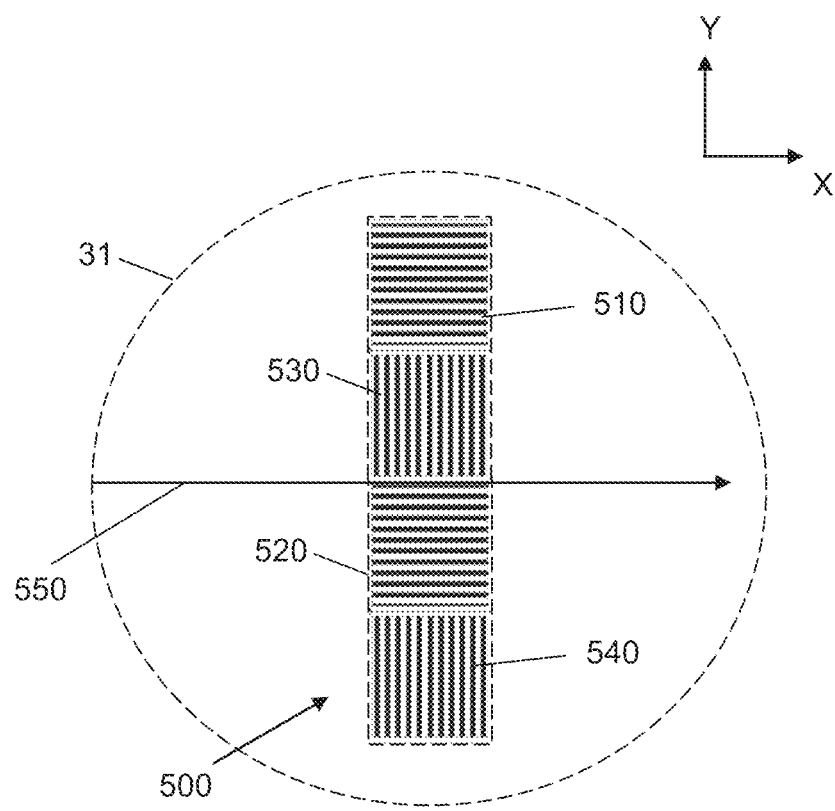
FIG. 8 schematically depicts an embodiment of a metrology target.

In FIG. 8, a new arrangement of the periodic structures 510, 520, 530 and 540 according to an embodiment is presented. While this embodiment of FIG. 8 and other embodiments of new metrology target arrangement are described in terms of periodic structures 510, 520, 530 and 540, different types of metrology target structures can be used.

In FIG. 8, an illumination spot 31 is presented that illuminates the metrology target 500. In an embodiment, the illumination spot 31 illuminates at least one periodic structure of the metrology target 500. In this example, the illumination spot 31 illuminates all of the periodic structures of the metrology target 500.

In the arrangement of the metrology target of FIG. 8, the periodic structures 510, 520, 530 and 540 are arranged such that, within the illumination spot, there is only one type of periodic structure along a particular direction 550 within the spot, which particular direction will be referred to herein as a spectral axis. In the example of FIG. 8, there are two types of periodic structure, namely a first type of periodic structures 510, 520 and a second type of periodic structures 530, 540. So, as shown in FIG. 8, along the X-direction within the illumination spot, there is only one type of periodic structure. As seen in FIG. 8, for all instances of the X-direction throughout the spot, there is only one type of periodic structure. Further, in this embodiment, along a particular direction (e.g., the X-direction in FIG. 8) within the spot, there is only a single periodic structure of a particular type.

So, in this new arrangement, instead of a traditional square metrology target with four periodic structures in a square arrangement, there is provided a "one dimensional" type of metrology target (which can be equivalent in functionality as the traditional square metrology target). This new target can have the same area (i.e., it may not require more space on the substrate) and can accumulate the same overlay data as the traditional square metrology target.

Figure 9:
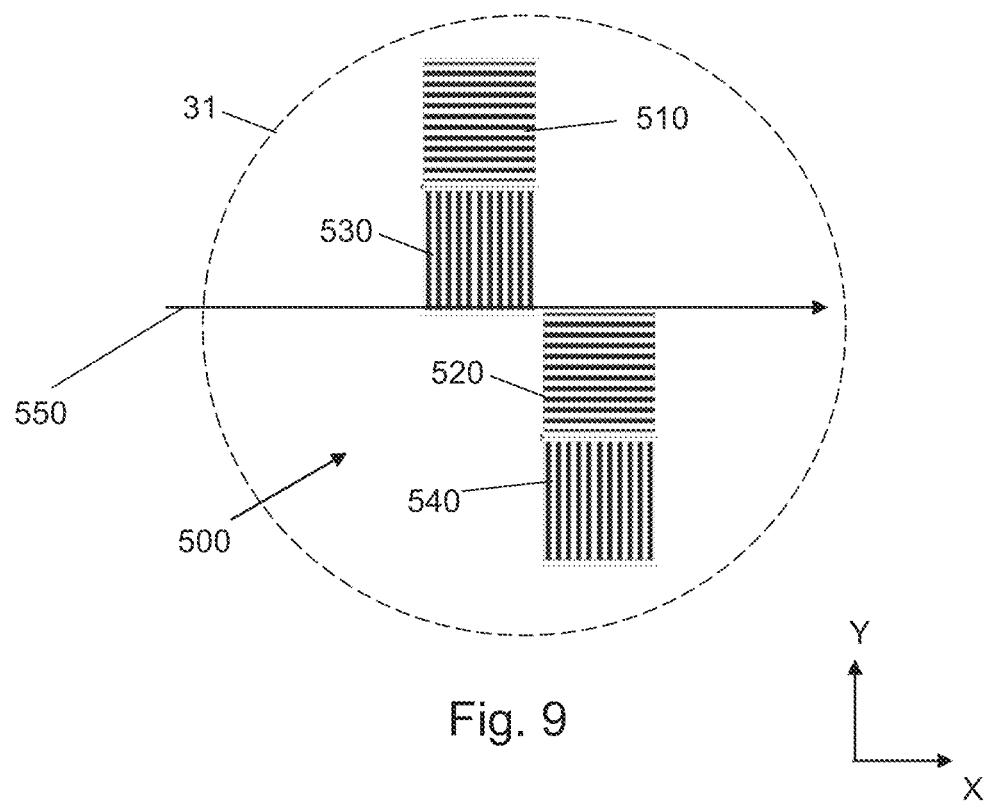
FIG. 9 schematically depicts an embodiment of a metrology target.

Referring to FIG. 9, a further variant of the new arrangement is depicted. Like FIG. 8, it is a "one dimensional" target with only one type of periodic structure along a spectral axis 550 within the spot. In this embodiment, a first set of periodic structures of different types is offset along the spectral axis from a second set of periodic structures of different types. In this example, the periodic structures of the first set are aligned along a direction orthogonal to the spectral axis and similarly the periodic structures of the second set are aligned along a direction orthogonal to the spectral axis.

Figure 10:
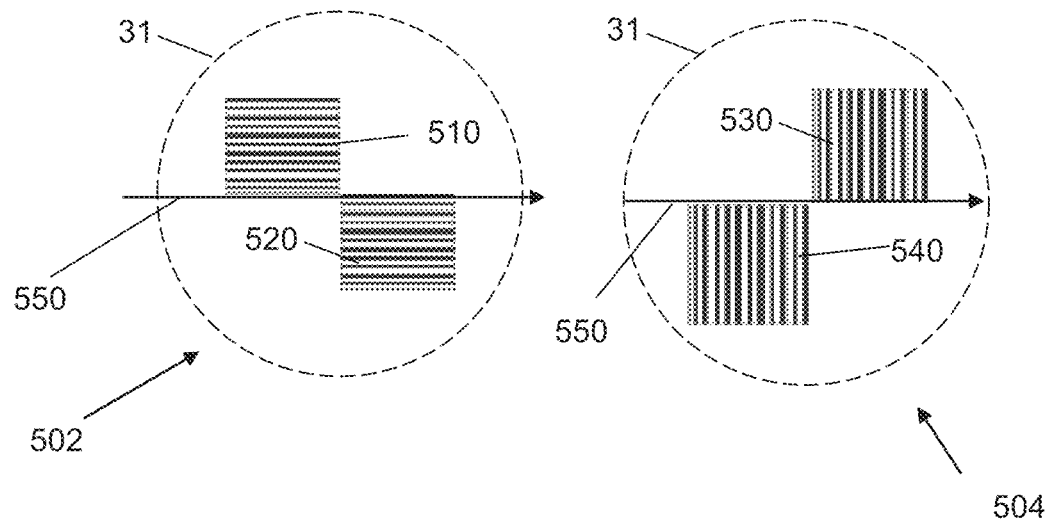
FIG. 10 schematically depicts an embodiment of a metrology target.

In FIG. 10, a further variant of the new arrangement is depicted. In this embodiment, there are two separate illumination spots 31 that illuminate metrology sub-targets 502 and 504 at a same time (if the spacing is sufficiently apart between targets 502, 504) or at different times (but at the expense of target measurement throughput). Yet, like FIGS. 8 and 9, it is a "one dimensional" target with only one type of periodic structure along a spectral axis 550 within each spot. In this embodiment, a first set of periodic structures of a first type is one illumination spot while a second set of periodic structure of a second type is another illumination spot. However, it is possible to have two or more different types of periodic structure in each illumination spot. Further, in this example, a periodic structure of the first set is offset from another periodic structure of the first set along the spectral axis and a periodic structure of the second set is offset from another periodic structure of the second set along the spectral axis, but this need not be the case.

Figure 11:
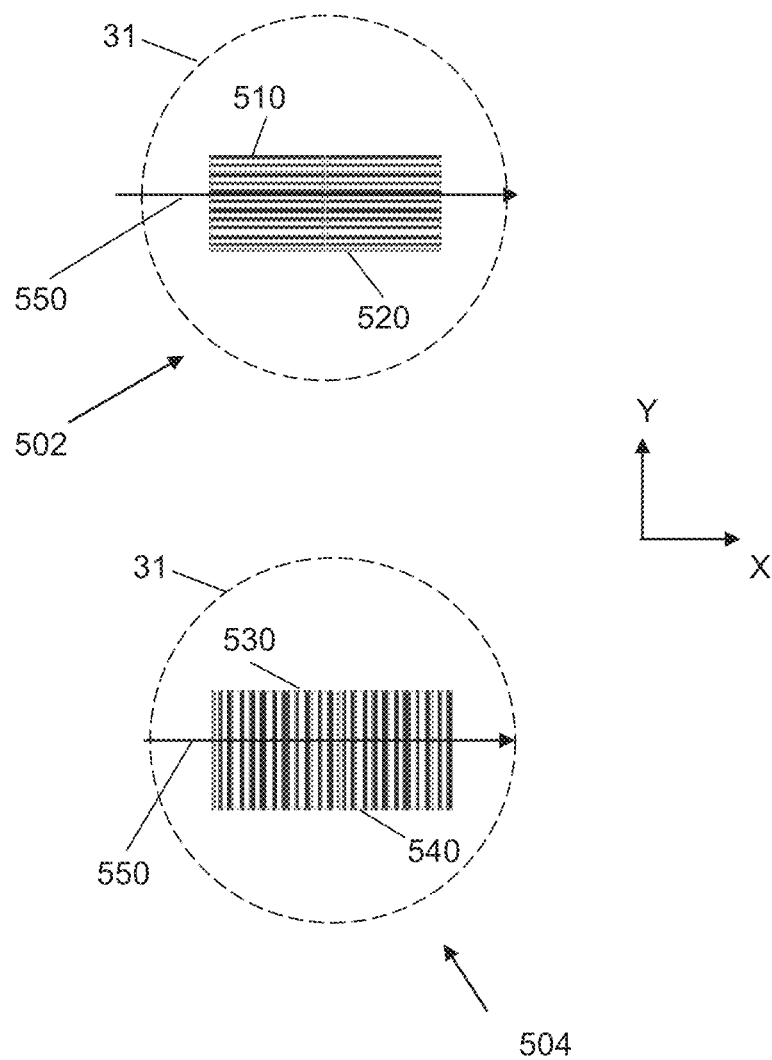
FIG. 11 schematically depicts an embodiment of a metrology target.

FIG. 11 shows a further variant of the new arrangement. In this embodiment, there are two separate illumination spots 31 that illuminate metrology sub-targets 502 and 504 at a same time (if the spacing is sufficiently apart between targets 502, 504) or at different times (but at the expense of target measurement throughput). Yet, like FIGS. 8, 9 and 10, it is a "one dimensional" target with only one type of periodic structure along a spectral axis 550 within each spot. In this embodiment, a first set of periodic structures of a first type is one illumination spot while a second set of periodic structure of a second type is another illumination spot. However, it is possible to have two or more different types of periodic structure in each illumination spot.

So, a common feature for the targets of FIGS. 8-11 is a particular spatial direction along which there is just one periodic structure type. This feature distinguishes them from the target of FIG. 7 which has at least two periodic structure types along a particular direction. So, while the targets can be implemented with variations of periodic structures, they have a distinguishing feature of having only one periodic structure type along a particular direction.

Advantageously, this new arrangement of a metrology target can allow parallel measurement with radiation of two different values or types of measurement beam characteristics, such as a plurality of wavelengths, for example, in combination with a plurality of polarizations. In an embodiment, this metrology target arrangement can be used with the inspection apparatus of FIG. 6 to enable the spatial separation of radiation of two different values or types of measurement beam characteristics so that a certain parameter can be measured with radiation at each of those two different values or types of measurement beam characteristics. Specifically, in an embodiment, the dispersion element can be arranged to disperse in a direction orthogonal to the spectral axis or direction of the metrology target. So, the one dimensional type of target can function as an input slit of the inspection apparatus to enable spatial dispersion of the radiation without overlap of radiation from periodic structures of a different type. In an embodiment and as described further hereafter, the new dispersive element (e.g., a prism or diffraction grating) in the inspection apparatus, such as the apparatus of FIG. 6, can form a stack of "spectrums" on the one or more detectors along the spectral axis and so enable discrete channels of different values or types of measurement beam characteristics to be measured (e.g., channels for each of the periodic structures 510, 520, 530, 540 for each of the +1 diffraction order and the −1 diffraction order along with values corresponding to a plurality of wavelengths for each of those 8 channels and optionally each of those channels can be at a plurality of polarizations such as two polarizations to yield 16 channels, each of the 16 channels having values corresponding to a plurality of wavelengths).

Figure 12:
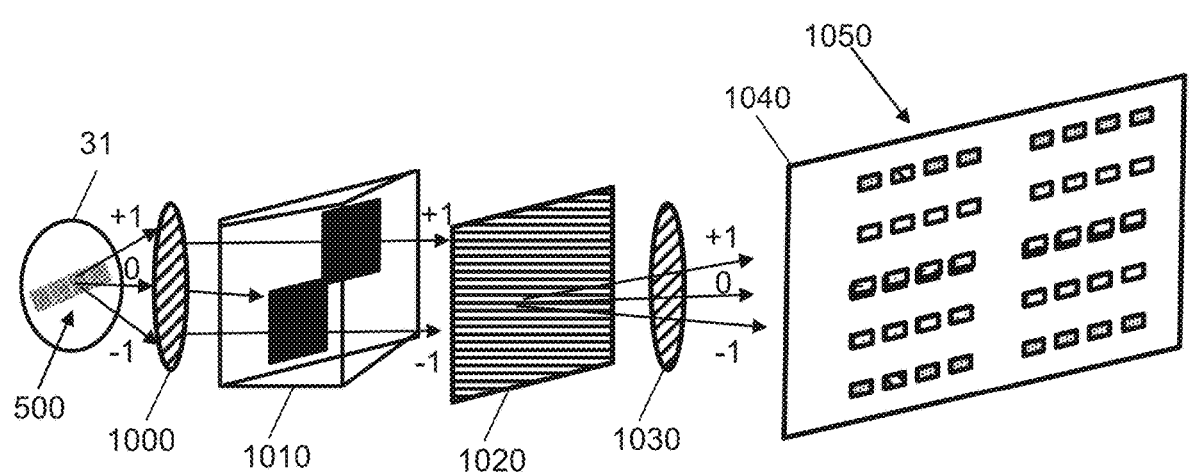
FIG. 12 schematically depicts an embodiment of part of an inspection apparatus.
Figure 12:
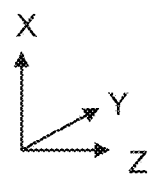

Referring to FIG. 12, use of the "one dimensional" arrangement of a metrology target with an inspection apparatus having a dispersive element is schematically presented. A "one dimensional" target 500 having a spectral axis in the Y direction (such as the target 500 of FIG. 8) is illuminated with an illumination spot 31. The redirected radiation from the target 500 is collected by objective 1000. As shown, 0, +1 order and −1 order radiation is collected by objective 1000; as will be appreciated, other diffraction orders can be captured. The radiation is received by one or more optical elements 1010, which in this case has a 0 order block to block the 0 order radiation collected by the objective 1000 while allowing the +1 and −1 order radiation to pass toward the detector. Moreover, the one or more optical elements 1010 diverges the +1 and −1 order (in this case, along the Y axis direction) so that they can be separately detected. In an embodiment, by the "one dimensional" arrangement of the target 500 and the divergence provided by the one or more optical elements 1010, each of the periodic structures can be spatially separated in the Y axis direction onto one or more detectors 1040 (e.g., one or more CCD photodetectors) and as well have the +1 and 1-order radiation from each of those periodic structures to be spatially separated onto the one or more detectors along the Y axis direction as described further hereafter. The +1 and 1-order radiation is then dispersed by wavelength by dispersive element 1020. In this example, the dispersive element 1020 disperses the radiation along the X axis direction, i.e., a direction orthogonal to the spectral axis. In this example, the dispersive element 1020 is a grating and so diffracts the +1 radiation into 0, +1 order, and −1 order components as shown as well as diffracts the −1 radiation into 0, +1 order, and −1 order components as shown. The +1, −1 order radiation from the dispersive element 1020 is spatially spread along the X axis direction and has varying wavelengths along that X axis direction. The radiation from dispersive element 1020 is directed by optical element 1030 (e.g., a lens) to one or more detectors 140. So, the optical system of FIG. 12 optically forms a new format of distributed output data 1050 on the one or more detector 1040. Details of this distribution 1050 will be described hereafter.

Figure 13:
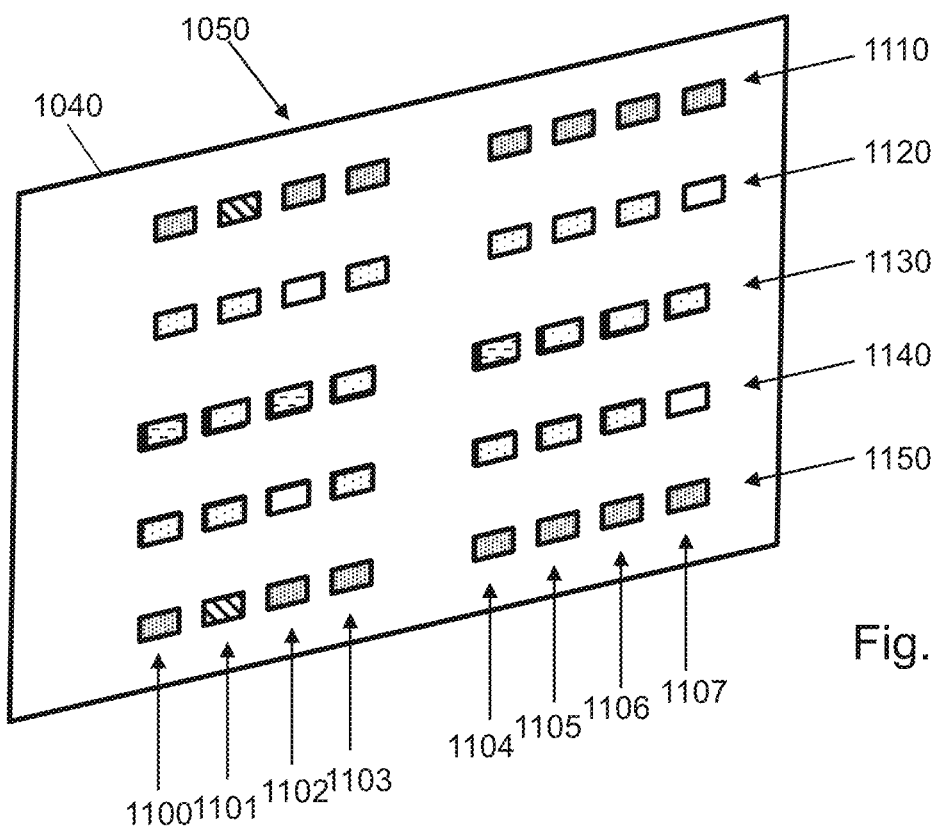
FIG. 13 schematically depicts an embodiment of a detection by a detector of an inspection apparatus.

Referring to FIG. 13, the distribution 1050 at one or more detectors 1040 (e.g., a single detector) is schematically presented. As noted above, the one or more optical elements 1010 and the "one dimensional" arrangement of target 500 (having four periodic structures being measured) enables creation of channels 1100-1107 corresponding to the periodic structures 510, 520, 530, 540 as well as separately for the +1 order and −1 order radiation diffracted from periodic structures 510, 520, 530, 540. So, in an embodiment, channel 1100 can correspond to the +1 order radiation from periodic structure 510, channel 1101 can correspond to the +1 order radiation from periodic structure 520, channel 1102 can correspond to the +1 order radiation from periodic structure 530, and channel 1103 can correspond to the +1 order radiation from periodic structure 540. Similarly, in an embodiment, channel 1104 can correspond to the −1 order radiation from periodic structure 510, channel 1105 can correspond to the −1 order radiation from periodic structure 520, channel 1106 can correspond to the −1 order radiation from periodic structure 530, and channel 1107 can correspond to the −1 order radiation from periodic structure 540. As will be appreciated the number of channels depends on the number of diffraction orders from the target 500 being measured and the number of periodic structures of the target 500 being measured. That is, the number of channels corresponds to the number of diffraction orders being measured times the number of periodic structures being measured. So, 2 diffraction orders (e.g., +1 and −1) times 4 periodic structures results in 8 channels.

While not shown in FIG. 13, where the optical system provides a polarizing element to provide separate types of polarization, each of the channels 1100-1107 can be multiplied by the number of different polarizations provided by the polarizing element. So, for example, if two polarizations (e.g., linear X polarization and linear Y polarization) are provided by the polarizing element, then there would be provided 16 channels for the "one dimensional" arrangement of target 500 (having four periodic structures being measured)—the channels 1100-1107 for a first polarization and then another set of channels 1100-1107 (not shown in FIG. 13) for a second polarization.

Further, for each of the channels, there is provided a dispersion of a plurality of wavelengths. In the example presented above, the dispersive element 1020 is a grating and so diffracts the +1 radiation into 0, +1 order, and −1 order components as well as diffracts the −1 radiation into 0, +1 order, and −1 order components as shown. The +1, −1 order radiation from the dispersive element 1020 is spatially spread along the X axis direction and has varying wavelengths along that X axis direction. So, referring to FIG. 13, in an embodiment, the 0 order radiation from dispersive element 1020 is provided to row 1130. So, the 0 order radiation from dispersive element 1020 corresponding to the +1 order radiation from the target 500 is provided to row 1130 and also the 0 order radiation from dispersive element 1020 corresponding to the −1 order radiation from the target 500 is provided to row 1130. As for the +1 order radiation from dispersive element 1020 corresponding to the +1 order radiation from the target 500 and the −1 order radiation from the target 500, it is provided to rows 1110 and 1120, each of rows 1110 and 1120 corresponding to a different radiation wavelength. As discussed above, the radiation corresponding to the +1 and −1 order radiation from the periodic structures 510, 520, 530, 540 will be provided to different portions of the rows 1110 and 1120 according to the channels 1100-1107 described above. Similarly, the −1 order radiation from dispersive element 1020 corresponding to the +1 order radiation from the target 500 and the −1 order radiation from the target 500 is provided to rows 1140 and 1150, each of rows 1140 and 1150 corresponding to a different radiation wavelength. As discussed above, the radiation corresponding to the +1 and −1 order radiation from the periodic structures 510, 520, 530, 540 will be provided to different portions of the rows 1140 and 1150 according to the channels 1100-1107 described above. Depending on the configuration of the dispersive element 1020, the wavelength of row 1110 is larger (or smaller) than the wavelength of row 1120 and similarly, the wavelength of 1150 is larger (or smaller) than the wavelength of row 1140. In an embodiment, the wavelength of row 1110 is substantially the same as that of row 1150 and the wavelength of row 1120 is substantially the same as that of row 1140. In an embodiment, there is provided discrete wavelengths at each of rows 1100, 1120, 1140 and 1150. In an embodiment, the dispersion can form a continuous wavelength spectrum and so rows 1100, 1120, 1140 and 1150 correspond to sampling points from the continuous wavelength spectrum.

Thus, in an embodiment, the optical system of FIG. 12 can optically form a new format of distributed output data 1050 on the detector. In an embodiment, where the target comprises four periodic structures and 2 diffraction orders being measured (e.g., +1 and −1 orders), the output data comprises 8 lines of spectrums (e.g., continuous spectrums or discrete spectrums) that hold the desired OV calculation information as a function of wavelength in a multiple wavelength range (e.g., a wide spectral range of, e.g., 400-1100 nm or any subrange therewithin or two or more discrete wavelengths). With a polarization splitter following a dispersion element in an optical pupil of the detection branch, two or more polarizations can be measured yielding further lines. For example, for two polarizations, 16 lines can be provided. Of course as discussed above, less or more lines can be provided depending on the desired number of periodic structures being measured, the desired number of diffraction orders being measured and/or the desired number of polarizations being measured.

The intensity values at the appropriate selections of row and channel can be applied in appropriate formulation to yield a desired parameter of interest. For the intensities can be applied to any of equations (1)-(7) as appropriate to arrive at an overlay value. For example, a first measurement radiation wavelength can be a first measurement beam characteristic and a second measurement radiation wavelength can be a second measurement beam characteristic and so intensity values from row 1120 and/or row 1140 from respective channels 1100-1107 can be applied to equations (3)-(7) as a first measurement beam characteristic and intensity values from row 1110 and/or row 1150 from respective channels 1100-1107 can be applied to equations (3)-(7) as a second measurement beam characteristic. In an embodiment, where the wavelength of row 1120 is substantially the same as row 1140, the intensity values of the rows 1120 and 1140 can be combined (e.g., summed, averaged, etc.) and applied to equations (3)-(7) as a first measurement beam characteristic and similarly, where the wavelength of row 1110 is substantially the same as row 1150, the intensity values of the rows 1110 and 1150 can be combined (e.g., summed, averaged, etc.) and applied to equations (3)-(7) as a second measurement beam characteristic.

Figure 14:
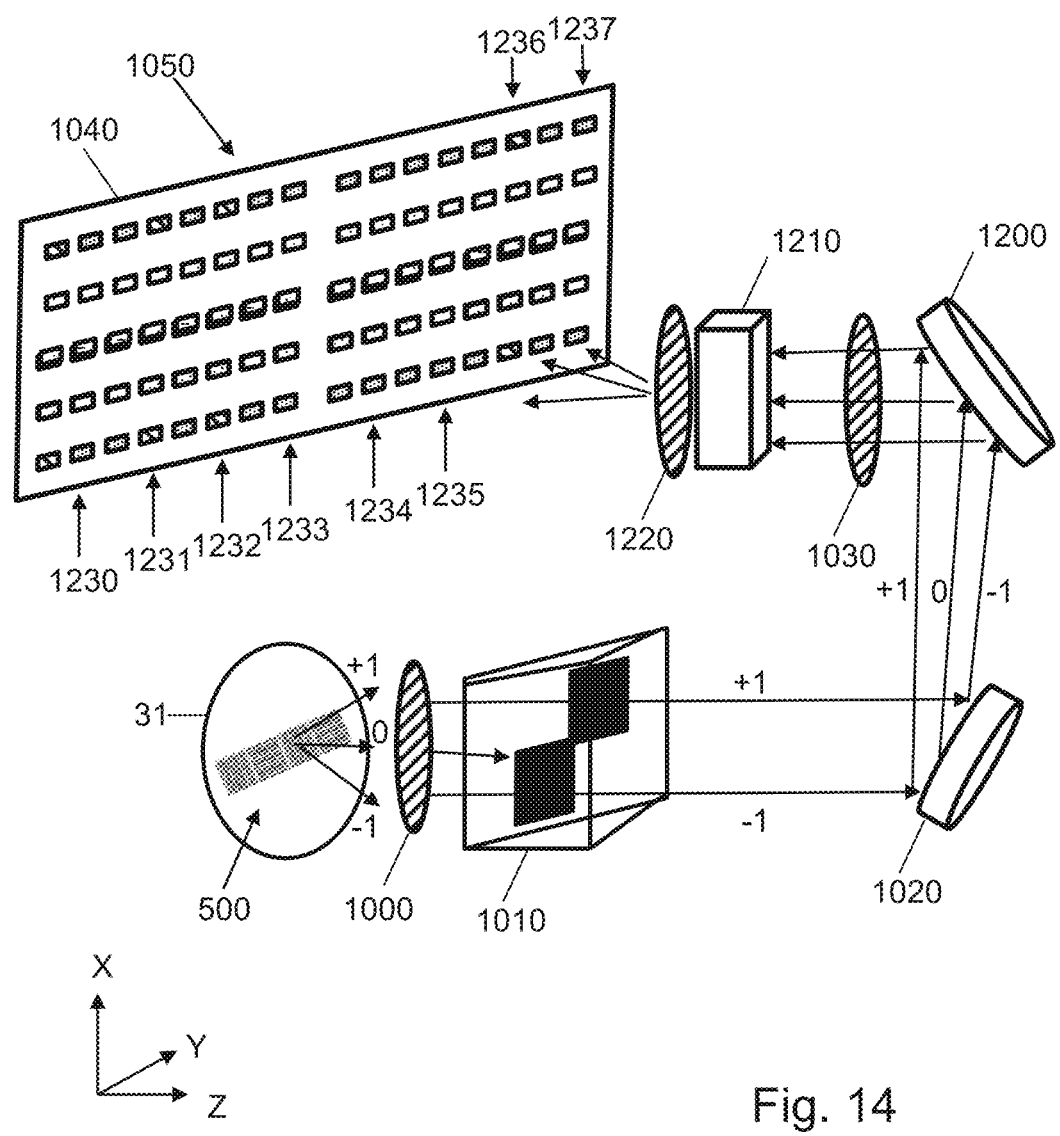
FIG. 14 schematically depicts an embodiment of part of an inspection apparatus.

Referring to FIG. 14, a further embodiment of an inspection apparatus used in combination with, e.g., a "one dimensional" arrangement of a metrology target is schematically depicted. Similarly, to the embodiment of FIG. 12, a "one dimensional" target 500 having a spectral axis in the Y direction (such as the target 500 of FIG. 8) is illuminated with an illumination spot 31. The redirected radiation from the target 500 is collected by objective 1000. As shown, 0, +1 order and −1 order radiation is collected by objective 1000; as will be appreciated, other diffraction orders can be captured. The radiation is received by one or more optical elements 1010, which in this case has a 0 order block to block the 0 order radiation collected by the objective 1000 while allowing the +1 and −1 order radiation to pass toward the detector. The one or more optical elements 1010 can diverge the +1 and −1 order (in this case, along the Y axis direction) so that they can be separately detected. In an embodiment, by the "one dimensional" arrangement of the target 500 and the divergence provided by the one or more optical elements 1010, each of the periodic structures can be spatially separated in the Y axis direction onto one or more detectors 1040 and as well have the +1 and 1-order radiation from each of those periodic structures to be spatially separated onto the one or more detectors along the Y axis direction as described further hereafter.

The +1 and 1-order radiation is then dispersed by wavelength by dispersive element 1020. In this example, the dispersive element 1020 disperses the radiation along the X axis direction, i.e., a direction orthogonal to the spectral axis. In this example, the dispersive element 1020 is a reflective grating and so diffracts the +1 radiation into 0, +1 order, and −1 order components as shown as well as diffracts the −1 radiation into 0, +1 order, and −1 order components as shown. The +1, −1 order radiation from the dispersive element 1020 is spatially spread along the X axis direction and has varying wavelengths along that X axis direction.

The radiation from dispersive element 1020 is, for example, redirected by optical element 1200 (e.g., a fold mirror) and optical element 1030 (e.g., an achromatic lens) toward an optional polarization splitter 1210 (e.g., a polarization prism) and optical element 1220 (e.g., field correcting lens to correct, for example, aberrations). The polarization splitter 1210 processes the radiation to produce at least two different types of polarization and, in an embodiment, helps to enable the different types of polarization to be spatially separated at the one or more detectors 1040. In an embodiment, the optical element 1220 (e.g., an achromatic lens) helps to enable the different types of polarization to be spatially separated at the one or more detectors 1040. Like dispersive element 1020, polarization splitter 1210 (and optionally optical element 1220) can be moved into and out of the radiation path using the various movement means described herein with respect to dispersive element 1020.

So, the optical system of FIG. 14 optically forms a new format of distributed output data 1050 at a detection plane on the detector. Details of an embodiment of this distribution 1050 have been described above and a further embodiment thereof is described now.

Specifically, where, e.g., polarization splitter 1210 (with optional optical element 1220) is provided to split the radiation into two types of polarization and the target 500 comprises four periodic structures to be measured, channel groups 1230-1237 can be provided wherein each channel group 1230-1237 comprises a channel/column/line for the first polarization and another channel/column/line for the second polarization and each channel group 1230-1237 comprises rows corresponding to wavelengths (see, e.g., FIG. 13 and its associated description). Further, each of the channel groups 1230-1237 corresponds to a particular periodic structure of the target and channel groups 1230-1233 correspond to, e.g., +1 order radiation from the target 500 and channel groups 1234-1237 correspond to, e.g., −1 order radiation from the target 500. So, 16 channels can be provided to enable separate measurement of two diffraction orders for four periodic structures of a target 500 at two different polarizations for a plurality of wavelengths (in the rows) in a single acquisition. A plurality of the measurement results can then be used in appropriate formulas, such as equations (1)-(7) to enable determination of a parameter of interest (e.g., overlay).

In this example embodiment, dispersive element 1020 can be shifted or rotated in order that in one orientation, the dispersive element 1020 enables a grating of the dispersive element 1020 to disperse the radiation by wavelength and by choosing the angle of rotation, different wavelength bands can be redirected towards the optical element 1200 and in another orientation, the dispersive element 1020 can be effectively switched to act like a mirror and merely redirects the radiation toward the one or more detectors 1040 without dispersing by wavelength. In an embodiment, the dispersive element 1020 can be shifted out of the optical path but the radiation is still directed from one or more optical elements 1010 toward the one or more detectors 1040, e.g., by dispersive element 1020 being replaced by another optical element that redirects the radiation toward the one or more detectors 1040.

Where dispersive element 1020 can be shifted, rotated, displaced out of position, etc. within the inspection apparatus, the remainder of the inspection apparatus can effectively be an existing inspection apparatus. For example, an existing inspection apparatus can be used to separate +1 and −1 order radiation and do so for two or more different polarizations. Accordingly, elements 1000, 1010, 1200, 1030, 1210, 1220 and 1040 can be an existing apparatus and optionally have element 1020 but element 1020 not capable of being a dispersive element. So, the inspection apparatus can be used in an existing fashion to measure radiation from a target such as shown in FIG. 7 for each of the periodic structures of the target. But, when the element 1020 is capable of being dispersive, used as a dispersive element and used in combination with a "one dimensional" type of target 500 such as shown in FIGS. 8-10, the inspection apparatus is capable of separately measuring radiation at a plurality of wavelengths for each periodic structure of the target (along with optionally doing so at each of a plurality of polarizations if polarization splitter 1210 is provided).

So, the new qualities of being able to measure at a plurality of wavelengths in a single acquisition can be provided in the layout of an existing inspection apparatus with relatively low expense and technical complication.

Figure 15:
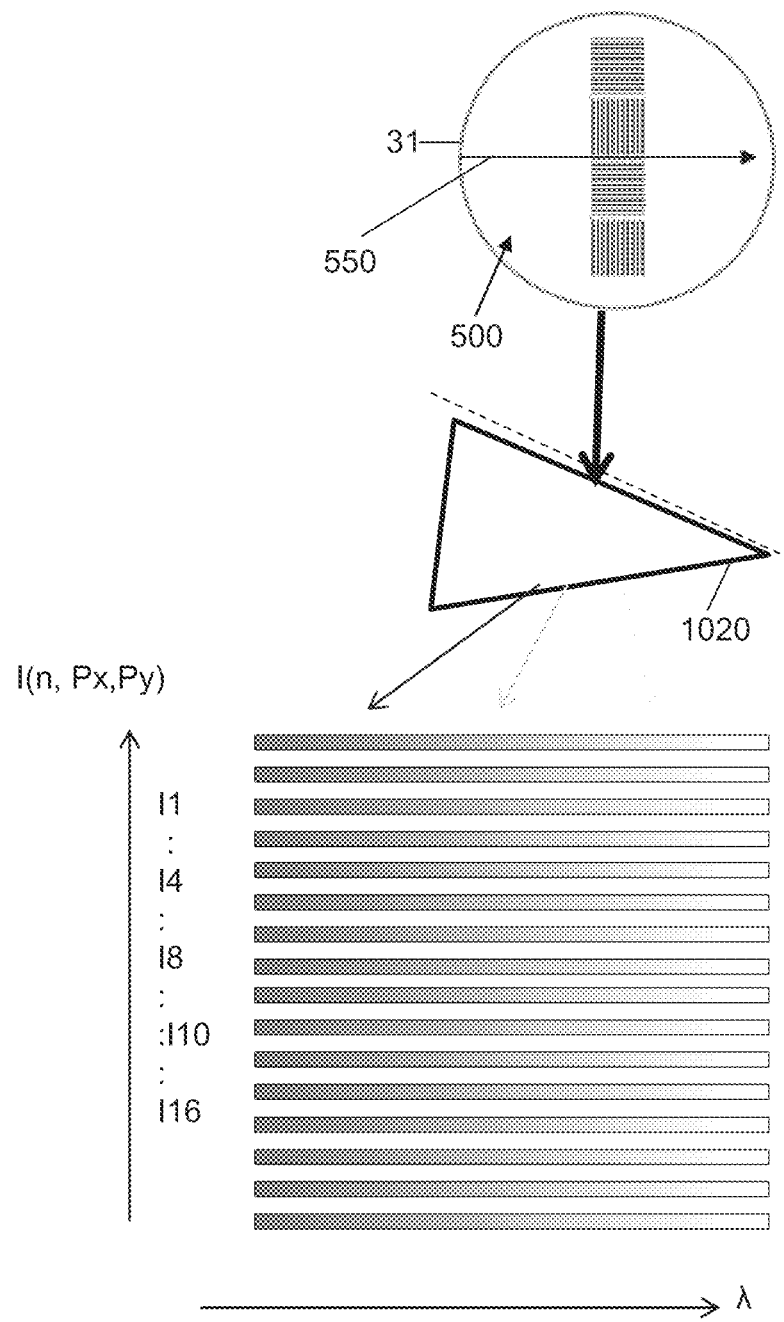
FIG. 15 schematically depicts a use of an embodiment of part of an inspection apparatus.

Referring to FIG. 15, an embodiment of the output data 1050 comprising continuous spectrums of radiation wavelength is presented. In an embodiment, the spectrums are across a relatively wide spectral range, e.g., from about 400 to 1000 nm with any sub-range selected therefrom. The radiation from target 500 is dispersed by dispersive element 1020 to produce intensity channels I. In this embodiment, the number of intensity I channels is a function of the number n of periodic structures being measured and separately includes the radiation for linear polarization in the X direction (Px) and the radiation for linear polarization in the Y direction (Py) (separated by an optical element not shown in FIG. 15) and separately includes the radiation for each of the positive and negative of a diffraction order (e.g., the +1 or −1 order) from the target 500 illuminated by beam spot 31. So, for a number n of 4, the number of channels I of 16 for 2 polarizations and the positive and negative diffraction order +1 and −1. In this embodiment, the output data 1050 is of just one of the diffraction orders (e.g., the +1 or −1 order) from the dispersive element 1020 grating. In an embodiment, just the intensity from one of the diffraction orders (e.g., the +1 or −1 order) from the dispersive element 1020 grating is used in calculating the parameter of interest. In an embodiment, intensity from both the diffraction orders (e.g., the +1 and −1 order) from the dispersive element 1020 grating is used in calculating the parameter of interest. In an embodiment, an optical arrangement can be used to join the radiation of the diffraction orders (e.g., the +1 and −1 order) together from the dispersive element 1020 grating in order for them to be illuminated together at a substantially same spot on the one or more detectors 1040 so that readings can be taken from that spot. In an embodiment, a first set of readings from each of the intensity channels I can be taken at one wavelength along the respective intensity channels I and used as a set of intensity values as a first measurement beam characteristic in a parameter of interest equation, such as equations (3)-(7), and a second set of readings from each of the intensity channels I can be taken at another wavelength along the respective intensity channels I and used as a set of intensity values as a second measurement beam characteristic in the parameter of interest equation, such as equations (3)-(7), in order to yield the parameter of interest.

So, the new hyperspectral method and apparatus described herein allow in one measurement acquisition to obtain significantly more data about a substrate stack under evaluation to obtain a more accurate determination of the parameter of interest. The implementation of this technique and apparatus can be done with minimal investment and using an existing apparatus. Moreover, it can enable backward compatibility in terms of allowing an existing apparatus into which the hyperspectral method and apparatus is implemented to still be able to measure according to its previous methods (e.g., measuring two diffraction orders (optionally at different polarizations), measuring two diffraction order at different wavelengths in subsequent measurements, etc.) which can be done, e.g., by rotating a dispersive element diffraction grating between zero order (e.g., a position where the dispersive grating is fully reflective so as not to provide dispersion) and first order (e.g., a position where the dispersive grating diffracts radiation to provide dispersion) orientations. That is, in an embodiment, the hyperspectral functionality can be implemented with backward compatibility by use of the zero order diffraction from a diffraction grating (e.g., dispersive element 1020 in FIG. 14) for existing processes of the inspection apparatus. Or, the backward compatibility can be retained by use of removable dispersive element (e.g., a highly dispersive prism, diffraction grating or combination of both (called GRISM)) in, e.g., a flip mount. When hyperspectral measurements are desired, the flip mount is used to insert the prism in the detection path; otherwise, the regular functionality of the inspection apparatus is available.

In an embodiment, the polarization splitter and dispersive element can be combined together in one optical element or combined in one unit of optical elements. In an embodiment, the combination of polarization splitter and dispersive element can be moved into or out of the optical path of the inspection apparatus.

In an embodiment, the illumination spot can be other than round. For example, the illumination spot can be of generally rectangular shape to help improve detecteability of the parameter of interest signal from optical noise from other patterns on the substrate.

In an embodiment, the wavelength range can be provided by a broadband radiation source. In an embodiment, the wavelength range of the radiation beam is limited to two or more wavelengths selected from a range (e.g., selected from the range of about 400 nm to 900 nm). Further, a selection of different polarizations of the radiation beam using, for example, a polarizer as described above may be provided as described above and/or various illumination shapes can be provided using, for example, a plurality of different apertures as described above.

In an embodiment, the parameter of interest measurement productivity of the inspection apparatus can be increased N times, where N is the number of measurement beam wavelengths to be measured (wherein N is selected from the range of 2 to 120 depending on the substrate stack, parameter of interest, etc.).

In an embodiment, the "one dimensional" target has approximately the same area as an existing type of target for the inspection apparatus. Thus, in an embodiment, the "one dimensional" target doesn't require more space on the substrate but can accumulate the same parameter of interest data as an existing target for the inspection apparatus. But, with the "one dimensional" target, its measurement method and associated, the "one dimensional" target can allow parallel wavelength measurement from a relatively broad spectral band and optionally polarization. These new qualities can be provided in the layout of an existing inspection apparatus with low investment and low technical complexity.

So, in an embodiment, the new method and design in combination creates a new feature: allowing the measurement of spectral information (e.g., continuously or discretely) along one axis (e.g., the spectral axis) of the detector system. This new feature in a new optical design for an inspection apparatus can be built in an existing inspection apparatus and can work with a radiation source that produces an illumination beam having a plurality of wavelengths (e.g., a continuous spectrum of wavelengths such as broadband light) in the range of about 400 nm to about 1000 nm and process the information from all desired wavelengths in one acquisition.

To enable this new feature, in an embodiment, a new metrology target (e.g., the structures of an overlay metrology target) is provided with structures aligned to geometrical and physical properties of the inspection apparatus detection branch and particularly to orientation of one or more newly introduced optical elements to enable measurement of different beam characteristics, i.e., a dispersive element and/or a polarization element. As a result, a parameter of interest can be determined with measurements made in parallel of radiation having information regarding the parameter of interest at a plurality of different measurement beam characteristics (e.g., different wavelengths). Thus, a plurality of measurement beam characteristics can be obtained in as single acquisition to allow for an increase in the productivity of the measurement process, as well as improve process robustness and accuracy. In an embodiment, the optical system to enable parallel measurement of different measurement characteristics can be used an existing inspection apparatus with minimal modifications of the optical layout (which can, e.g., reduce cost of development and manufacturing). Further, in an embodiment, the new hyperspectral features can be introduced in an existing inspection apparatus yet enable backward compatibility with measurement techniques available for the existing inspection apparatus.

So, an implementation of the new parameter of measurement method and the new optical layout for the detection branch of the inspection apparatus allows for a higher level of performance: greater productivity, greater process robustness (especially for opaque stacks) and/or greater measurement accuracy.

In an embodiment, there is provided an inspection apparatus, comprising: an objective configured to receive diffracted radiation from a metrology target having positive and negative diffraction order radiation; an optical element configured to separate the diffracted radiation into portions separately corresponding to each of a plurality of different values or types of one or more radiation characteristics and separately corresponding to the positive and negative diffraction orders; and a detector system configured to separately and simultaneously measure the portions.

In an embodiment, the optical element comprises a dispersive element and the plurality of different values or types of one or more radiation characteristics comprises a plurality of different wavelengths. In an embodiment, the optical element comprises a polarization element and wherein the plurality of different values or types of one or more radiation characteristics comprises a plurality of different polarizations. In an embodiment, the optical element is movable into and out of an optical path of the diffracted radiation or is configured to transform so as to allow the diffracted radiation to pass without separation. In an embodiment, the metrology target comprises a plurality of different types of periodic structures and wherein, within an illumination spot of the inspection apparatus, there is only one type of periodic structure along a particular direction within the spot. In an embodiment, the portions are arranged in a plurality of lines, wherein portions along each of the lines correspond to different values or types of the one or more radiation characteristics and wherein the lines correspond to different structures of the target. In an embodiment, the one or more radiation characteristics comprises radiation wavelength. In an embodiment, some of the lines further relate to a first type of polarization and some of the other lines further relate to a second type of polarization. In an embodiment, the optical element is movable within an optical path of the radiation or movable into and out of the optical path.

In an embodiment, there is provided a method comprising: receiving diffracted radiation from a metrology target having positive and negative diffraction order radiation; separating the diffracted radiation into portions corresponding to each of a plurality of different values or types of one or more radiation characteristics and to the positive and negative diffraction orders; and separately and simultaneously measuring the portions.

In an embodiment, the plurality of different values or types of one or more radiation characteristics comprises a plurality of different wavelengths. In an embodiment, the plurality of different values or types of one or more radiation characteristics comprises a plurality of different polarizations. In an embodiment, the method comprises illuminating the metrology target with an illumination beam spot, wherein the metrology target comprises a plurality of different types of periodic structures and wherein, within the spot, there is only one type of periodic structure along a particular direction within the spot. In an embodiment, the portions are arranged in a plurality of lines, wherein portions along each of the lines correspond to the different values or types of the one or more radiation characteristics and wherein the lines correspond to different structures of the target. In an embodiment, some of the lines further relate to a first type of polarization and some of the other lines further relate to a second type of polarization.

In an embodiment, there is provided a method comprising: illuminating a metrology target with an illumination beam spot, wherein the metrology target comprises a plurality of different types of periodic structures and wherein, within the spot, there is only one type of periodic structure along a particular direction within the spot; receiving radiation from the metrology target; and separating the received radiation into portions corresponding to each of a plurality of different values or types of one or more radiation characteristics.

In an embodiment, the receiving radiation has positive and negative diffraction order radiation and further comprising separating the received radiation into portions corresponding to the positive and negative diffraction orders. In an embodiment, the plurality of different values or types of one or more radiation characteristics comprises a plurality of different wavelengths. In an embodiment, the plurality of different values or types of one or more radiation characteristics comprises a plurality of different polarizations. In an embodiment, the portions are arranged in a plurality of lines, wherein portions along each of the lines correspond to the different values or types of the one or more radiation characteristics and wherein the lines correspond to different periodic structures of the target. In an embodiment, some of the lines further relate to a first type of polarization and some of the other lines further relate to a second type of polarization.

The embodiments may further be described using the following clauses:

1. An inspection apparatus, comprising:
  an objective configured to receive diffracted radiation from a metrology target having positive and negative diffraction order radiation;
  an optical element configured to separate the diffracted radiation into portions separately corresponding to each of a plurality of different values or types of one or more radiation characteristics and separately corresponding to the positive and negative diffraction orders; and
  a detector system configured to separately and simultaneously measure the portions.

2. The inspection apparatus of clause 1, wherein the optical element comprises a dispersive element and the plurality of different values or types of one or more radiation characteristics comprises a plurality of different wavelengths.

3. The inspection apparatus of clause 1 or clause 2, wherein the optical element comprises a polarization element and wherein the plurality of different values or types of one or more radiation characteristics comprises a plurality of different polarizations.

4. The inspection apparatus of any of clauses 1-3, wherein the optical element is movable into and out of an optical path of the diffracted radiation or is configured to transform so as to allow the diffracted radiation to pass without separation.

5. The inspection apparatus of any of clauses 1-4, wherein the metrology target comprises a plurality of different types of periodic structures and wherein, within an illumination spot of the inspection apparatus, there is only one type of periodic structure along a particular direction within the spot.

6. The inspection apparatus of any of clauses 1-5, wherein the portions are arranged in a plurality of lines, wherein portions along each of the lines correspond to different values or types of the one or more radiation characteristics and wherein the lines correspond to different structures of the target.

7. The inspection apparatus of clause 6, wherein the one or more radiation characteristics comprises radiation wavelength.

8. The inspection apparatus of clause 6 or clause 7, wherein some of the lines further relate to a first type of polarization and some of the other lines further relate to a second type of polarization.

9. The inspection apparatus of any of clauses 1-8, wherein the optical element is movable within an optical path of the radiation or movable into and out of the optical path.

10. A method comprising:
  receiving diffracted radiation from a metrology target having positive and negative diffraction order radiation;
  separating the diffracted radiation into portions corresponding to each of a plurality of different values or types of one or more radiation characteristics and to the positive and negative diffraction orders; and
  separately and simultaneously measuring the portions.

11. The method of clause 10, wherein the plurality of different values or types of one or more radiation characteristics comprises a plurality of different wavelengths.

12. The method of clause 10 or clause 11, wherein the plurality of different values or types of one or more radiation characteristics comprises a plurality of different polarizations.

13. The method of any of clauses 10-12, comprising illuminating the metrology target with an illumination beam spot, wherein the metrology target comprises a plurality of different types of periodic structures and wherein, within the spot, there is only one type of periodic structure along a particular direction within the spot.

14. The method of any of clauses 10-13, wherein the portions are arranged in a plurality of lines, wherein portions along each of the lines correspond to the different values or types of the one or more radiation characteristics and wherein the lines correspond to different structures of the target.

15. The method of clause 14, wherein some of the lines further relate to a first type of polarization and some of the other lines further relate to a second type of polarization.

16. A method comprising:
  illuminating a metrology target with an illumination beam spot, wherein the metrology target comprises a plurality of different types of periodic structures and wherein, within the spot, there is only one type of periodic structure along a particular direction within the spot;
  receiving radiation from the metrology target; and
  separating the received radiation into portions corresponding to each of a plurality of different values or types of one or more radiation characteristics.

17. The method of clause 16, wherein the receiving radiation has positive and negative diffraction order radiation and further comprising separating the received radiation into portions corresponding to the positive and negative diffraction orders.

18. The method of clause 16 or clause 17, wherein the plurality of different values or types of one or more radiation characteristics comprises a plurality of different wavelengths.

19. The method of any of clauses 16-18, wherein the plurality of different values or types of one or more radiation characteristics comprises a plurality of different polarizations.

20. The method of any of clauses 16-19, wherein the portions are arranged in a plurality of lines, wherein portions along each of the lines correspond to the different values or types of the one or more radiation characteristics and wherein the lines correspond to different periodic structures of the target.

21. The method of clause 20, wherein some of the lines further relate to a first type of polarization and some of the other lines further relate to a second type of polarization.

22. A computer program product comprising a computer non-transitory readable medium having instructions recorded thereon, the instructions when executed by a computer implementing the method of any of clauses 10-21.

23. A system comprising:
 a hardware processor system; and
 a non-transitory computer readable storage medium configured to store machine-readable instructions, wherein when executed, the machine-readable instructions cause the hardware processor system to perform a method of any of clauses 10-21.

24. A metrology apparatus for measuring an object of a patterning process, the metrology apparatus configured to perform the method of any of clauses 10-21.

25. A system comprising:
 a metrology apparatus configured to provide a beam of radiation onto an object surface and to detect radiation redirected by the structure on the object surface; and the computer program product of clause 22.

26. The system of clause 25, further comprising a lithographic apparatus comprising a support structure configured to hold a patterning device to modulate a radiation beam and a projection optical system arranged to project the modulated radiation beam onto a radiation-sensitive substrate, wherein the object is the substrate and the lithographic apparatus is configured to control a setting of the lithographic apparatus based on information obtained using the metrology apparatus and the computer program product.

Although an embodiment of the invention is described in relation to the $\pm 1^{st}$ diffraction orders, an embodiment of the invention may be applied using higher diffraction orders such as $\pm 2^{nd}$, $\pm 3^{rd}$, $\pm 4^{th}$, etc. diffraction orders.

Embodiments have been described herein in relation to diffraction-based metrology, which, for example, measures the relative position of overlapping periodic structures from the intensity from the diffracted orders. However, embodiments herein may be applied, with appropriate modification where needed, to image-based metrology, which, for example, measures the relative position from target 1 in layer 1 to target 2 in layer 2 using high-quality images of the targets. Usually these targets are periodic structures or "boxes" (Box-in-Box (BiB)).

Although specific reference may have been made above to the use of embodiments in the context of metrology and optical lithography, it will be appreciated that embodiments may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments reveals the general nature of embodiments of the invention such that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. An inspection apparatus, comprising:
 an objective configured to receive diffracted radiation from a metrology target having positive and negative diffraction order radiation;
 a detector system; and
 an optical element configured to spatially separate the diffracted radiation into portions at one or more detection surfaces of the detector system separately corresponding to each of a plurality of different values or types of one or more radiation wavelength and/or polarization characteristics in a first direction and separately corresponding to the positive and negative diffraction orders in a second direction transverse to the first direction,
 wherein the detector system is configured to separately and simultaneously measure the portions.

2. The inspection apparatus of claim 1, wherein the optical element comprises a dispersive element and the plurality of different values or types of one or more radiation wavelength and/or polarization characteristics comprises a plurality of different wavelengths.

3. The inspection apparatus of claim 1, wherein the optical element comprises a polarization element and wherein the plurality of different values or types of one or more radiation wavelength and/or polarization characteristics comprises a plurality of different polarizations.

4. The inspection apparatus of claim 1, wherein the optical element is movable into and out of an optical path of the diffracted radiation or is configured to transform so as to allow the diffracted radiation to pass without separation.

5. The inspection apparatus of claim 1, wherein the metrology target comprises a plurality of different types of periodic structures and wherein, within an illumination spot of the inspection apparatus, there are at least two periodic structures of different types and/or at least two periodic structures of a same type but different design but there is only one type of periodic structure along a particular direction within the spot.

6. The inspection apparatus of claim 1, wherein the portions are arranged in a plurality of lines, wherein portions along each of the lines correspond to different values or types of the one or more radiation wavelength and/or polarization characteristics and wherein the lines correspond to different structures of the target.

7. The inspection apparatus of claim 6, wherein the one or more radiation wavelength and/or polarization characteristics comprises radiation wavelength.

8. The inspection apparatus of claim 6, wherein some of the lines further relate to a first type of polarization and some of the other lines further relate to a second type of polarization.

9. The inspection apparatus of claim 1, wherein the optical element is movable within an optical path of the radiation or movable into and out of the optical path.

10. A method comprising:
receiving diffracted radiation from a metrology target having positive and negative diffraction order radiation;
spatially separating the diffracted radiation into portions at a detector system corresponding to each of a plurality of different values or types of one or more radiation wavelength and/or polarization characteristics in a first direction and corresponding to the positive and negative diffraction orders in a second direction transverse to the first direction; and
separately and simultaneously measuring the portions.

11. The method of claim 10, wherein the plurality of different values or types of one or more radiation wavelength and/or polarization characteristics comprises a plurality of different wavelengths.

12. The method of claim 10, wherein the plurality of different values or types of one or more radiation wavelength and/or polarization characteristics comprises a plurality of different polarizations.

13. The method of claim 10, comprising illuminating the metrology target with an illumination beam spot, wherein the metrology target comprises a plurality of different types of periodic structures and wherein, within the spot, there is only one type of periodic structure along a particular direction within the spot.

14. The method of claim 10, wherein the portions are arranged in a plurality of lines, wherein portions along each of the lines correspond to the different values or types of the one or more radiation wavelength and/or polarization characteristics and wherein the lines correspond to different structures of the target.

15. The method of claim 14, wherein some of the lines further relate to a first type of polarization and some of the other lines further relate to a second type of polarization.

16. A method comprising:
illuminating a metrology target with an illumination beam spot, wherein the metrology target comprises a plurality of different types of periodic structures and wherein, within the spot, there are at least two periodic structures of different types and/or at least two periodic structures of a same type but different design but there is only one type of periodic structure along a particular direction within the spot;
receiving radiation from the metrology target; and
separating the received radiation into portions corresponding to each of a plurality of different values or types of one or more radiation wavelength and/or polarization characteristics.

17. The method of claim 16, wherein the receiving radiation has positive and negative diffraction order radiation and further comprising separating the received radiation into portions corresponding to the positive and negative diffraction orders.

18. The method of claim 16, wherein the plurality of different values or types of one or more radiation wavelength and/or polarization characteristics comprises a plurality of different wavelengths.

19. The method of claim 16, wherein the plurality of different values or types of one or more radiation wavelength and/or polarization characteristics comprises a plurality of different polarizations.

20. The method of claim 16, wherein the portions are arranged in a plurality of lines, wherein portions along each of the lines correspond to the different values or types of the one or more radiation wavelength and/or polarization characteristics and wherein the lines correspond to different periodic structures of the target.

21. The method of claim 20, wherein some of the lines further relate to a first type of polarization and some of the other lines further relate to a second type of polarization.

22. An inspection apparatus, comprising:
an objective configured to receive diffracted radiation from a metrology target having positive and negative diffraction order radiation;
a detector system; and
an optical element configured to separate the diffracted radiation into portions at one or more detection surfaces of the detector system separately corresponding to each of a plurality of different values or types of wavelength characteristics and separately corresponding to the positive and negative diffraction orders,
wherein the detector system is configured to separately and simultaneously measure the portions.

* * * * *